United States Patent
Okita et al.

(10) Patent No.: US 7,595,250 B2
(45) Date of Patent: Sep. 29, 2009

(54) SEMICONDUCTOR DEVICE AND METHOD OF MANUFACTURING THE SAME

(75) Inventors: Yoichi Okita, Kawasaki (JP); Genichi Komuro, Kawasaki (JP)

(73) Assignee: Fujitsu Microelectronics Limited, Tokyo (JP)

(*) Notice: Subject to any disclaimer, the term of this patent is extended or adjusted under 35 U.S.C. 154(b) by 113 days.

(21) Appl. No.: 11/490,252

(22) Filed: Jul. 21, 2006

(65) Prior Publication Data

US 2006/0258114 A1 Nov. 16, 2006

Related U.S. Application Data

(62) Division of application No. 10/351,336, filed on Jan. 27, 2003, now Pat. No. 7,102,186.

(30) Foreign Application Priority Data

Apr. 16, 2002 (JP) .............................. 2002-113937

(51) Int. Cl.
*H01L 21/44* (2006.01)

(52) U.S. Cl. .................. 438/396; 438/240; 438/244; 438/387; 438/696; 257/E21.006; 257/E21.009; 257/E21.011; 257/E21.346; 257/E21.664

(58) Field of Classification Search ................ 438/396, 438/397, 239, 240, 244, 253, 303, 387, 595, 438/696; 257/E21.006, 9, 11, 38, 279, 346, 257/391, 664, E27.104
See application file for complete search history.

(56) References Cited

U.S. PATENT DOCUMENTS

| 5,069,747 A * | 12/1991 | Cathey et al. ............... 438/696 |
| 5,913,150 A | 6/1999 | Takaishi |
| 6,320,214 B1 | 11/2001 | Matsuda et al. |
| 6,335,551 B2 | 1/2002 | Takemura |
| 6,351,006 B1 * | 2/2002 | Yamakawa et al. .......... 257/310 |

(Continued)

FOREIGN PATENT DOCUMENTS

JP    05-129156 A    5/1993

(Continued)

OTHER PUBLICATIONS

Office Action from Japanese Patent Office dated May 23, 2006.

*Primary Examiner*—Michael S Lebentritt
(74) *Attorney, Agent, or Firm*—Westerman, Hattori, Daniels & Adrian, LLP.

(57) ABSTRACT

There are provided the steps of forming an insulating film over a semiconductor substrate, forming sequentially a first conductive film, a dielectric film, a second conductive film on the insulating film, etching the second conductive film and the dielectric film into a first pattern shape by using a first mask, removing the first mask, and etching simultaneously the first conductive film and the second conductive film having the first pattern shape by using a second mask to form a plurality of capacitor upper electrodes made of the second conductive film and also form a plate line as a capacitor lower electrode, which is covered with the dielectric film having the first pattern shape and has a contact region, made of the first conductive film. Accordingly, a plurality of capacitors can be formed on the capacitor lower electrode with good precision.

13 Claims, 35 Drawing Sheets

U.S. PATENT DOCUMENTS

| | | | |
|---|---|---|---|
| 6,396,092 B1 * | 5/2002 | Takatani et al. | 257/295 |
| 6,420,744 B1 | 7/2002 | Kim et al. | |
| 6,570,203 B2 | 5/2003 | Hikosaka et al. | |
| 6,909,134 B2 * | 6/2005 | Song et al. | 257/296 |
| 7,547,937 B2 * | 6/2009 | Yamanobe | 257/296 |
| 2001/0022372 A1 * | 9/2001 | Kanaya et al. | 257/295 |
| 2003/0205738 A1 | 11/2003 | Kanaya et al. | |
| 2004/0041193 A1 * | 3/2004 | Komuro | 257/304 |
| 2004/0082175 A1 | 4/2004 | Nakagawa | |

FOREIGN PATENT DOCUMENTS

| | | |
|---|---|---|
| JP | 2001-257320 A | 9/2001 |
| JP | 2002-094021 A | 3/2002 |

* cited by examiner

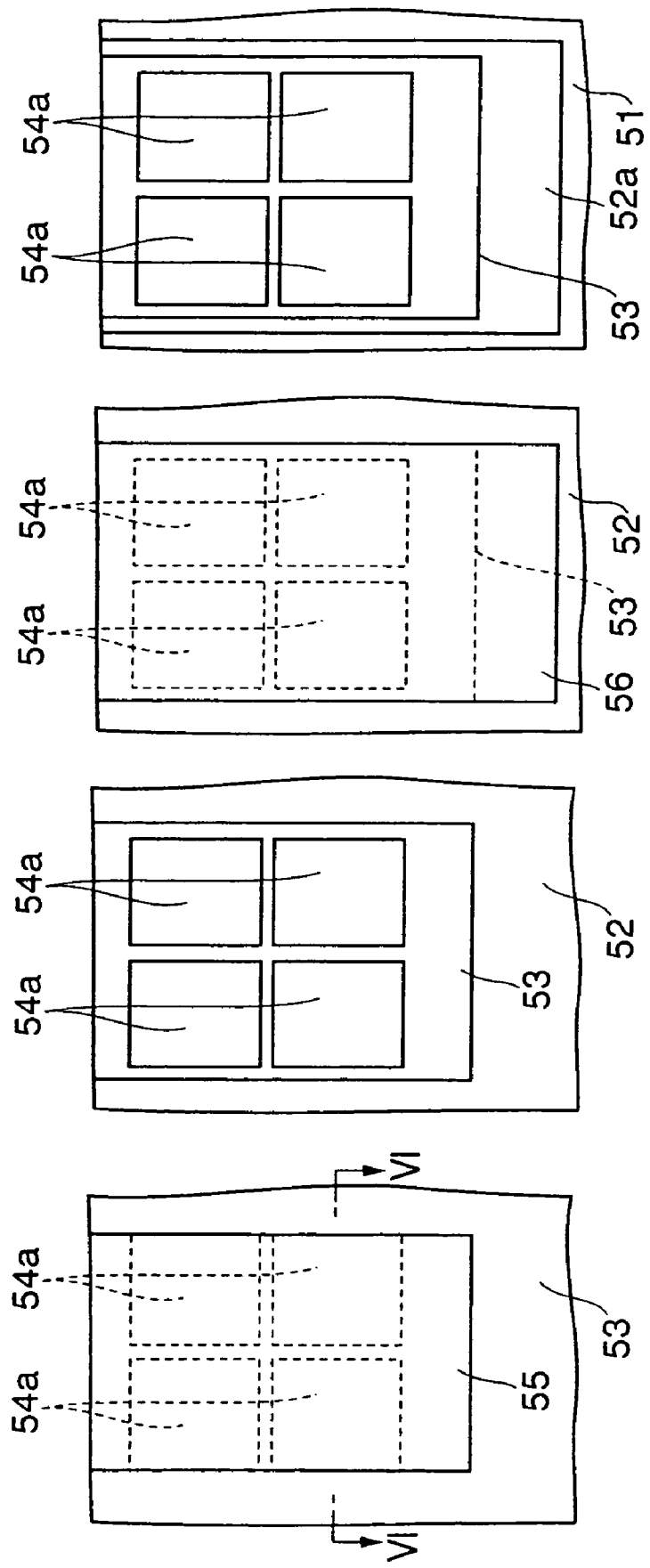

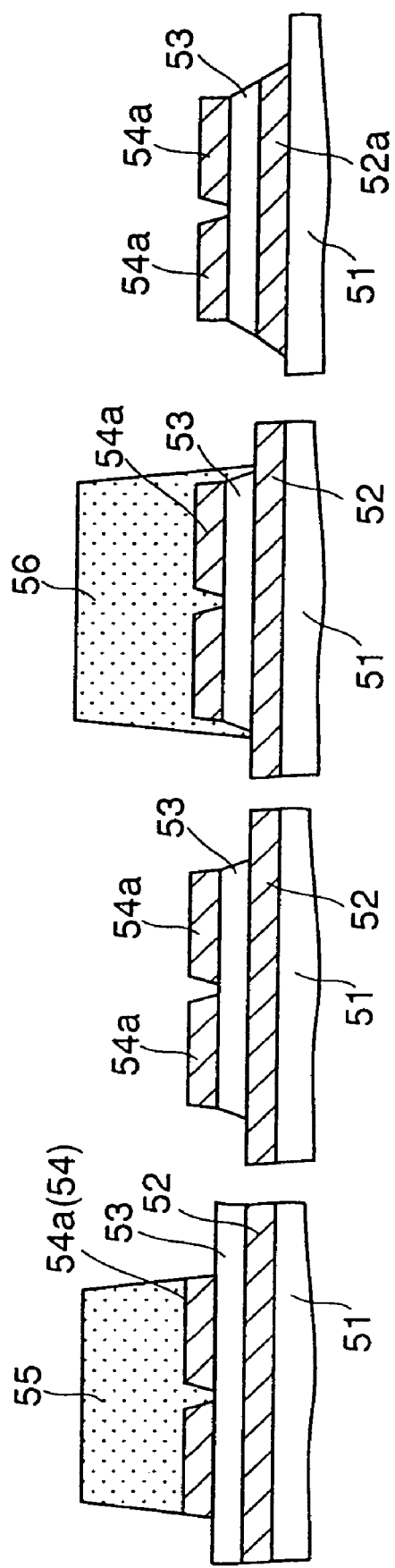

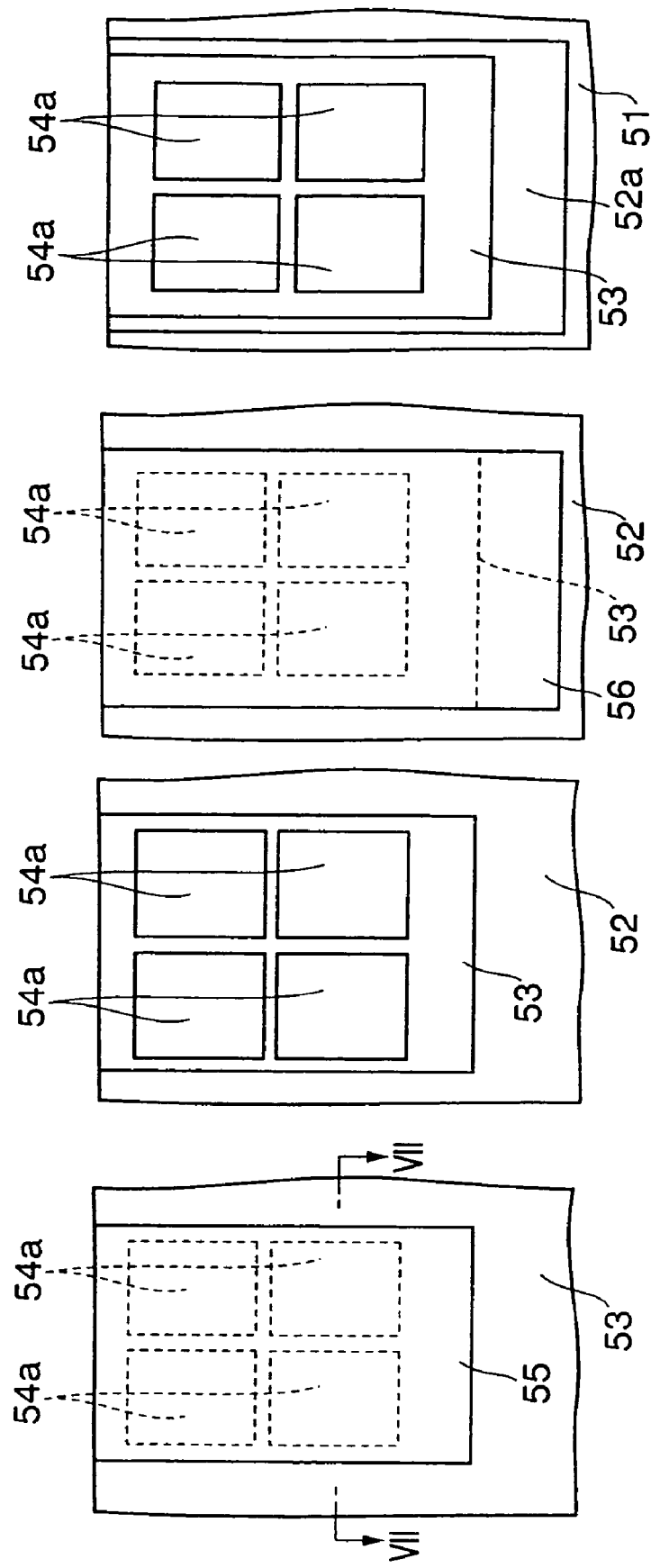

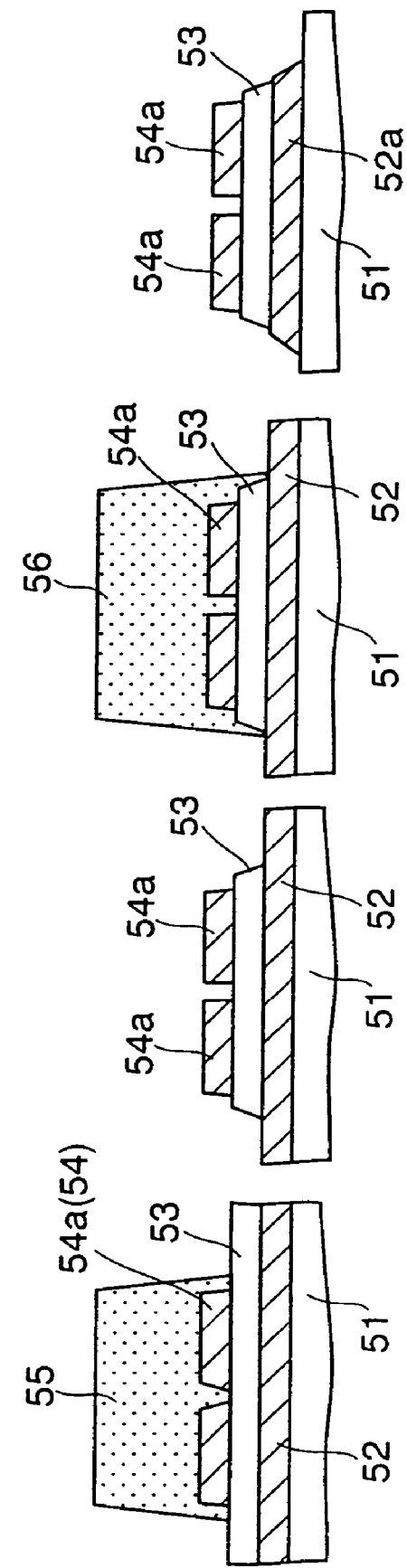

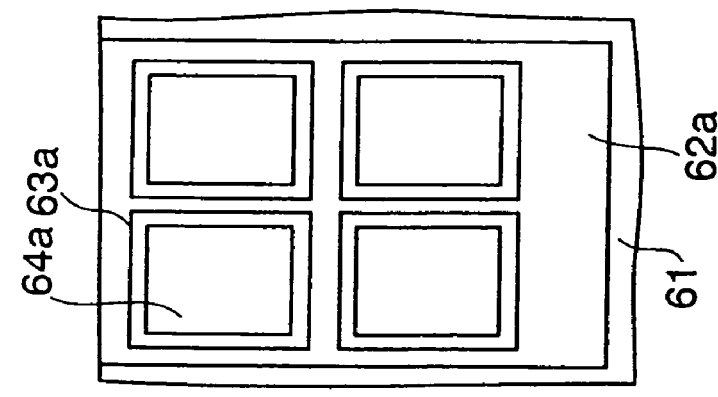
FIG. 15A  FIG. 15B
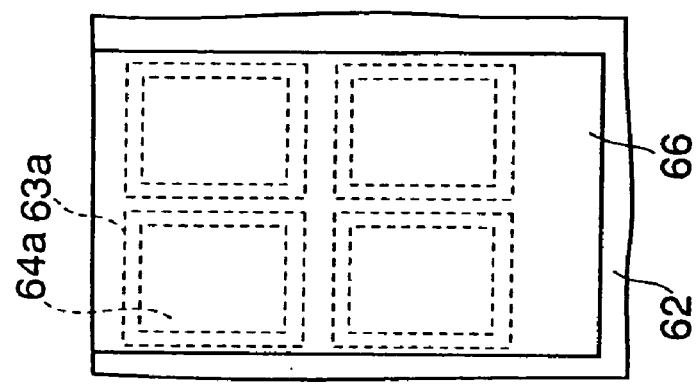
FIG. 15C  FIG. 15D
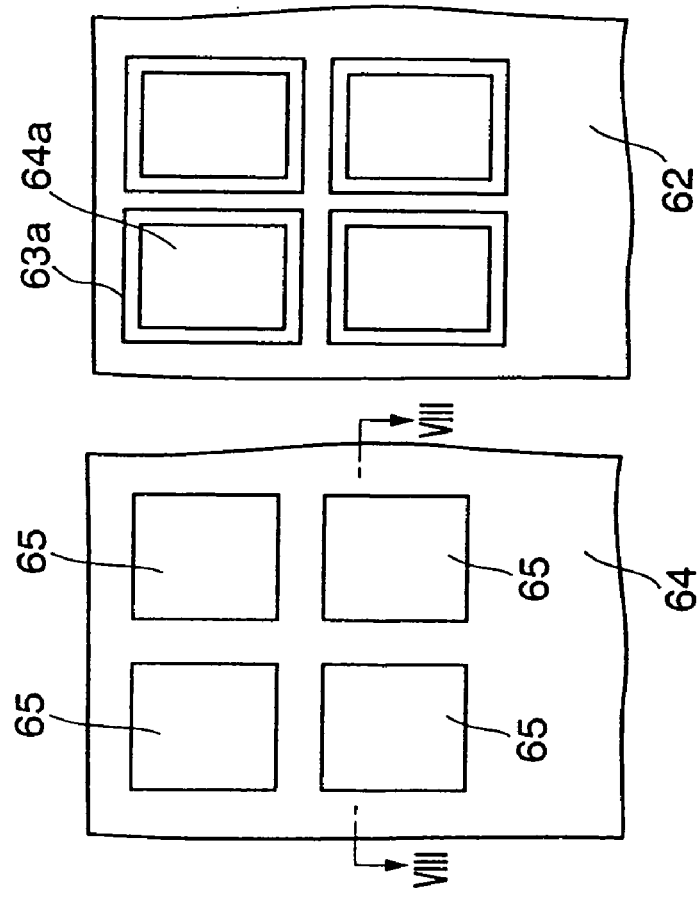

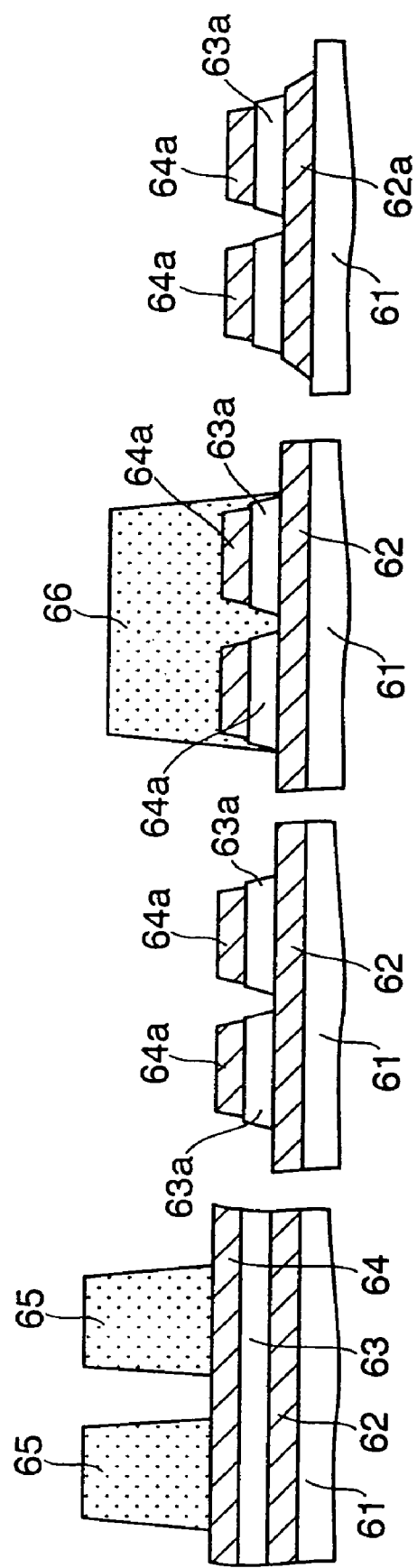

SEMICONDUCTOR DEVICE AND METHOD OF MANUFACTURING THE SAME

This application is a divisional of application Ser. No. 10/351,336, filed on Jan. 27, 2003.

CROSS-REFERENCE TO RELATED APPLICATIONS

This application is based upon and claims priority of Japanese Patent Application No. 2002-113937, filed on Apr. 16, 2002, the contents being incorporated herein by reference.

BACKGROUND OF THE INVENTION

1. Field of the Invention

The present invention relates to a semiconductor device and a method of manufacturing the same and, more particularly, a semiconductor device having a capacitor and a method of manufacturing the same.

2. Description of the Prior Art

As one of nonvolatile memories that can store information after the power supply is turned OFF, FeRAM (Ferroelectric Random Access Memory) having a ferroelectric substance is known. Since FeRAM has a structure that stores the information by utilizing the hysteresis characteristic of the ferroelectric substance and can be operated at high speed at a low consumption power, its further development is expected in the future as the nonvolatile memory which is subjected to a large number of writing operations.

FIG. 1 shows an example of a circuit diagram of a memory cell of FeRAM. This view is a circuit diagram of a 1T1C-type memory cell that employs one transistor $T_o$ and one capacitor $C_o$ to store 1-bit information.

The 1T1C-type memory cell needs a reference capacitor $C_1$ that generates a reference voltage to decide the charge read from the memory cell is "1" data or "0" data. The polarization of the reference capacitor $C_1$ is reversed every time when the data are read. The decision of data is executed based on the level of potential of a capacitor $C_0$ of each memory cell with respect to potential of the reference capacitor $C_1$. The reference capacitor $C_1$ is connected to an end portion of each bit line BIT. It is preferable that ideally the potential of the reference capacitor $C_1$ should be set to an intermediate value between a voltage $V_1$, which is used to write "1" into the memory cell, and a voltage $V_0$, which is used to write "0" into the memory cell.

As the memory cell, there is a 2T2C-type memory cell in addition to the 1T1C-type memory cell. The 2T2C-type memory cell is of the type that employs two transistors and two capacitors to store 1-bit information. Such 2T2C-type memory cell has a circuit configuration that executes a complementary operation such that "1" or "0" data is stored in one capacitor and opposite data is stored in the other capacitor, and reads polarized states of both capacitors upon deciding the data to execute the decision of data by using a difference between them.

The 1T1C-type memory cell can reduce a cell area to about half rather than the 2T2C-type memory cell.

Next, a configuration of the 1T1C-type memory cell will be explained hereunder. FIG. 2 is a plan view of the 1T1C-type memory cell, and FIG. 3 shows a sectional view taken along a I-I line in FIG. 2. In this case, illustration of interlayer insulating films on a semiconductor substrate is omitted in FIG. 2.

In FIG. 2 and FIG. 3, a plurality of active regions (wells) 103, each of which is surrounded by an element isolation layer 102, are formed vertically and horizontally at an interval on a surface layer of a semiconductor substrate 101. Two gate electrodes 105, which are also used as word lines WL extended in the Y direction, are formed on each active region 103 via a gate insulating film 104. The word line WL is formed to extend onto the element isolation layer 102. In each active region 103, first to third impurity diffusion regions 107a, 107b, 107c are formed on both sides of two gate electrodes 105.

One gate electrode 105 and the impurity diffusion regions 107a, 107b on both sides of the electrode constitute one MOS transistor $T_o$, and the other gate electrode 105 and the impurity diffusion regions 107b, 107c on both sides of the electrode constitute another MOS transistor $T_o$. That is, two transistors are formed in each active region 103.

The transistor $T_o$ and the element isolation layer 102 are covered with an insulating cover film 108. Also, a first interlayer insulating film 109 is formed on the insulating cover film 108.

A plurality of stripe-like capacitor lower electrodes 111 that extend in the Y direction are formed on the first interlayer insulating film 109 and over the element isolation layer 102 in the X direction at an interval. Then, ferroelectric films 112 each having the substantially same shape as the capacitor lower electrode 111 are formed on the capacitor lower electrodes 111. Then, a plurality of capacitor upper electrodes 113 are aligned on each ferroelectric film 112 in the Y direction. One capacitor upper electrode 113, the underlying ferroelectric film 112, and the capacitor lower electrode 111 constitute one capacitor $C_o$.

Also, a second interlayer insulating film 114 is formed on the capacitor $C_o$ and the first interlayer insulating film 109. Then, first to third contact holes 114a, 114b, 114c are formed in the first and second interlayer insulating films 109, 114 and the insulating cover film 108 on the first to third impurity diffusion regions 107a, 107b, 107c in the active region 103. Then, first to third conductive plugs 115a, 115b, 115c are formed in the first to third contact holes 114a, 114b, 114c respectively. Then, fourth contact holes 114d are formed in the second interlayer insulating film 114 on the capacitor upper electrodes 113, and then fourth conductive plugs 115d are formed in the fourth contact holes 114d.

A first metal wiring 116a that connects the first contact hole 114a and the neighboring fourth conductive plug 115d is formed on the second interlayer insulating film 114. Also, a second metal wiring 116c that connects the third contact hole 114c and the neighboring fourth conductive plug 115d is formed on the second interlayer insulating film 114.

Accordingly, a plurality of capacitor upper electrodes 113, which are aligned over each capacitor lower electrode 111, are connected to MOS transistors $T_o$ on the silicon substrate 101 on a one-by-one basis respectively.

In this case, a metal pad 116b is formed in the second interlayer insulating film 114 on the second conductive plug 115b. A bit line 117 that is formed over the metal pad 116b via a third interlayer insulating film (not shown) is connected to the metal pad 116b. The bit line 117 extends in the direction that intersects orthogonally with the word line WL and the capacitor lower electrode 111 respectively.

Meanwhile, the above capacitor is formed by methods described in the following.

The first method is such a method that a first conductive film, a ferroelectric film, and a second conductive film are formed sequentially on the first interlayer insulating film 109, then the capacitor upper electrodes 113 are formed by patterning the second conductive film, and then the ferroelectric films 112 and the capacitor lower electrodes 111 are formed by patterning the ferroelectric film and the first conductive film while using the same mask.

The second method is such a method that the first conductive film, the ferroelectric film, and the second conductive film are formed sequentially on the first interlayer insulating film 109, then the capacitor upper electrodes 113 are formed by patterning the second conductive film and the ferroelectric film while using the same mask, and then the capacitor lower electrodes 111 are formed by patterning the first conductive film.

The third method is such a method that the first conductive film, the ferroelectric film, and the second conductive film are formed sequentially on the first interlayer insulating film 109, and then the capacitor upper electrodes 113, the ferroelectric films 112 and the capacitor lower electrodes 111 are formed by patterning individually the first conductive film, the ferroelectric film, and the second conductive film while using separate masks respectively.

According to the first, second, and third methods, since the capacitor lower electrodes 111 are formed after the capacitor upper electrodes 113 are formed, there is a chance that areas of the capacitor upper electrodes 113 are reduced by the displacement of the mask that is used to pattern the capacitor lower electrodes 111. In order to prevent the reduction of the capacitor upper electrodes 113, the capacitor lower electrodes 111 may be formed widely. But this structure disturbs the higher integration of the memory cell regions.

Also, according to the second method, since the capacitor lower electrodes 111 are exposed from the ferroelectric films 112 in regions between the capacitor upper electrodes 113 on the capacitor lower electrodes 111, there is a chance that reduction of the capacitors is accelerated by the catalytic action of platinum that constitutes the capacitor lower electrodes 111.

In addition, according to the third method, since the capacitor upper electrodes 113, the ferroelectric films 112, and the capacitor lower electrodes 111 are formed by using separate masks, throughput is lowered.

SUMMARY OF THE INVENTION

It is an object of the present invention to provide a semiconductor device capable of forming a plurality of capacitors on a capacitor lower electrode, which are formed in the memory cell region, with good precision and a method of manufacturing the same.

According to one aspect of the present invention, there is provided a semiconductor device comprising: a first insulating film formed over a semiconductor substrate; a capacitor lower electrode formed over the first insulating film to have a contact region; capacitor upper electrodes formed over the capacitor lower electrode at an interval mutually; a dielectric film formed between the capacitor lower electrode and the capacitor upper electrodes to cover the capacitor lower electrode in an area between the capacitor upper electrodes; and an isolated conductive pattern formed around the contact region of the capacitor lower electrode and having a same layer structure as a conductive film constituting the capacitor upper electrodes. According to another aspect of the invention, there is provided a manufacturing method of a semiconductor device comprising the steps of: forming a first insulating film over a semiconductor substrate; forming sequentially a first conductive film, a dielectric film, a second conductive film over the first insulating film; forming a first mask on the second conductive film; etching the second conductive film and the dielectric film into a first pattern shape by using the first mask; removing the first mask; forming the second masks having capacitor upper electrode shape on the second conductive film; and etching simultaneously the first conductive film exposed from at least one of the dielectric film and the second masks and the second conductive film having the first pattern shape exposed from the second masks to form capacitor upper electrodes made of the second conductive film and also form a plate line as a capacitor lower electrode, which has a contact region, made of the first conductive film.

According to the present invention, the first conductive film, the dielectric film, and the second conductive film are formed sequentially on the insulating film, then the second conductive film and the dielectric film are patterned into the first pattern shape by using the first mask, and then the first conductive film and the second conductive film are patterned simultaneously by using the second mask. Thus, plural capacitor upper electrodes are formed from the second conductive film and also the plate line (lower electrode) is formed from the first conductive film. Hence, the capacitor is constructed by the capacitor upper electrode, the dielectric film, and the capacitor lower electrode, and the capacitors are present on the plate line as many as the capacitor upper electrodes.

Therefore, since the capacitors are formed by using two masks, the throughput of the capacitor forming steps can be improved. Also, the first conductive film and the second conductive film are patterned simultaneously. As a result, the dielectric film is left in the state of the first pattern by adjusting the etching conditions, the capacitor lower electrode is covered with the dielectric film in areas between the capacitor upper electrodes, and reduction of the capacitor by the catalyst of the platinum-group metal constituting the capacitor lower electrode is suppressed.

Also, the capacitor upper electrodes and the capacitor lower electrode are patterned simultaneously. As a result, the capacitor forming patterning executed after the formation of the capacitor upper electrodes is eliminated, and there is no possibility that the capacitor upper electrodes are etching once again, and thus the capacitor upper electrodes are formed with good precision.

In addition, the mask having the second pattern for covering the contact region of the plate line and the third pattern having the capacitor shape is employed as the second mask used to form the capacitor lower electrode. In this case, the second pattern of the second mask is overlapped with an edge of the first conductive film by taking account of positional displacement of the second mask, whereby the isolated conductive pattern made of the second conductive film is formed near the contact region of the plate line. Since the isolated conductive pattern is covered with the interlayer insulating film, such isolated conductive pattern is isolated electrically not to constitute the actually-operating cell.

Also, there is a possibility that, during the etching of the first and second conductive films using the second mask, the second mask is reduced in size by the reaction with the etching gas. As the countermeasure against this reduction, after the second conductive film is patterned into the first pattern shape and before the second mask is formed on the second conductive film, the second conductive film is covered with the capacitor protection insulating film and then the capacitor protection insulating film is etched by using the second mask and is left selectively under the second mask.

According to this, since the capacitor protection insulating film having the capacitor upper electrode shape functions as a mask, the second conductive film is patterned into the initial shape of the second mask even if the second mask is reduced in size. Thus, the capacitor upper electrode is formed with good precision.

BRIEF DESCRIPTION OF THE DRAWINGS

FIGS. 11A to 11D are plan views showing steps of forming a capacitor of a memory cell according to a comparative example 1;

FIGS. 12A to 12D are sectional views showing steps of forming the capacitor of the memory cell according to the comparative example 1;

FIGS. 13A to 13D are plan views showing steps of forming a capacitor of a memory cell according to a comparative example 2;

FIGS. 14A to 14D are sectional views showing steps of forming the capacitor of the memory cell according to the comparative example 2;

FIGS. 15A to 15D are plan views showing steps of forming a capacitor of a memory cell according to a comparative example 3; and FIGS. 16A to 16D are sectional views showing steps of forming the capacitor of the memory cell according to the comparative example 3.

DESCRIPTION OF THE PREFERRED EMBODIMENTS

Embodiments of the present invention will be explained with reference to the drawings hereinafter.

First Embodiment

FIGS. 4A to 4J are sectional views showing steps of forming a capacitor of a memory cell of a semiconductor device according to a first embodiment of the present invention. FIGS. 5A to 5G and 11B are sectional views showing steps of forming a transistor and its periphery of the memory cell of the semiconductor device according to the first embodiment of the present invention. FIGS. 6A to 6H are plan views showing steps of forming a capacitor of the memory cell of the semiconductor device according to the first embodiment of the present invention.

Figure 5A:
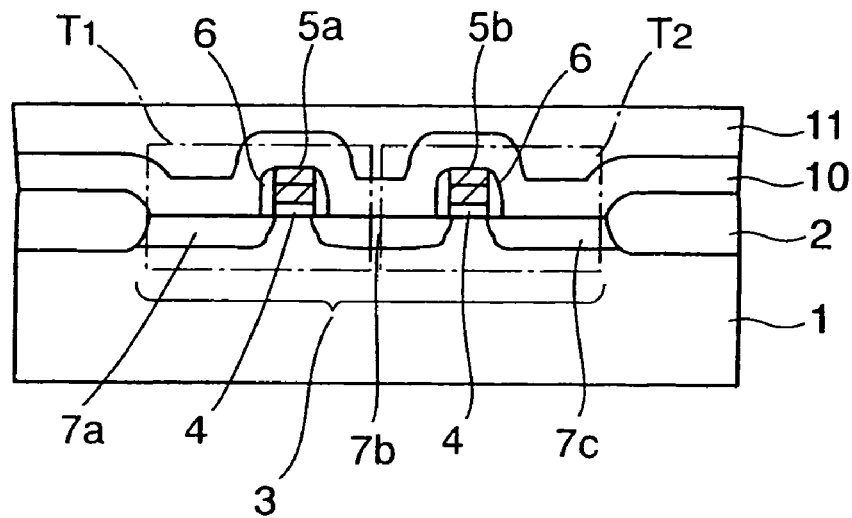
FIGS. 5A to 5G are sectional views showing steps of forming a transistor and its periphery of the memory cell of the semiconductor device according to the first embodiment of the present invention.
Figure 5B:
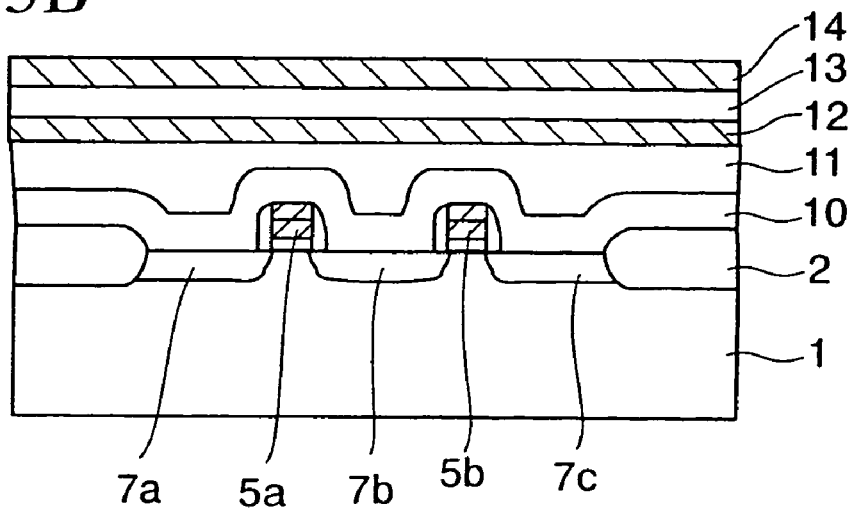
Figure 5C:
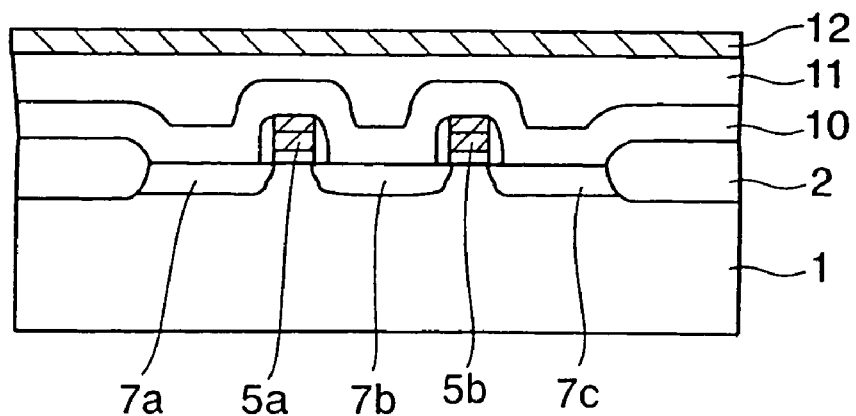
Figure 5D:
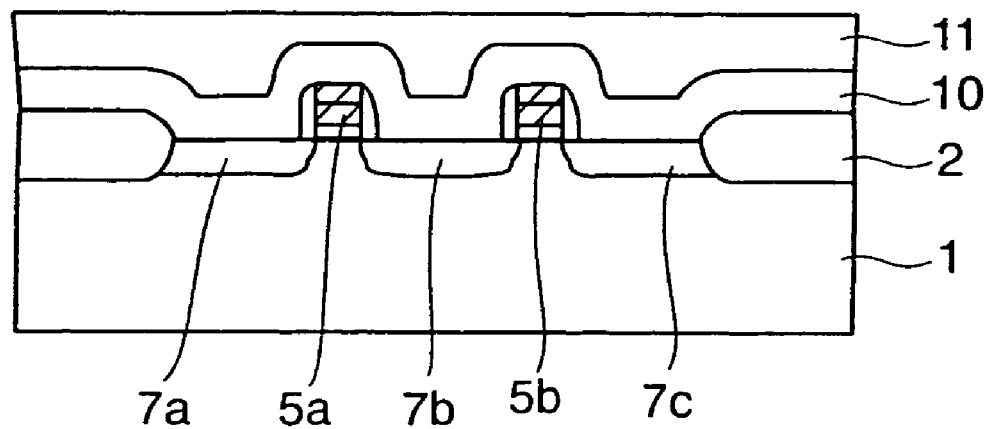
Figure 5E:
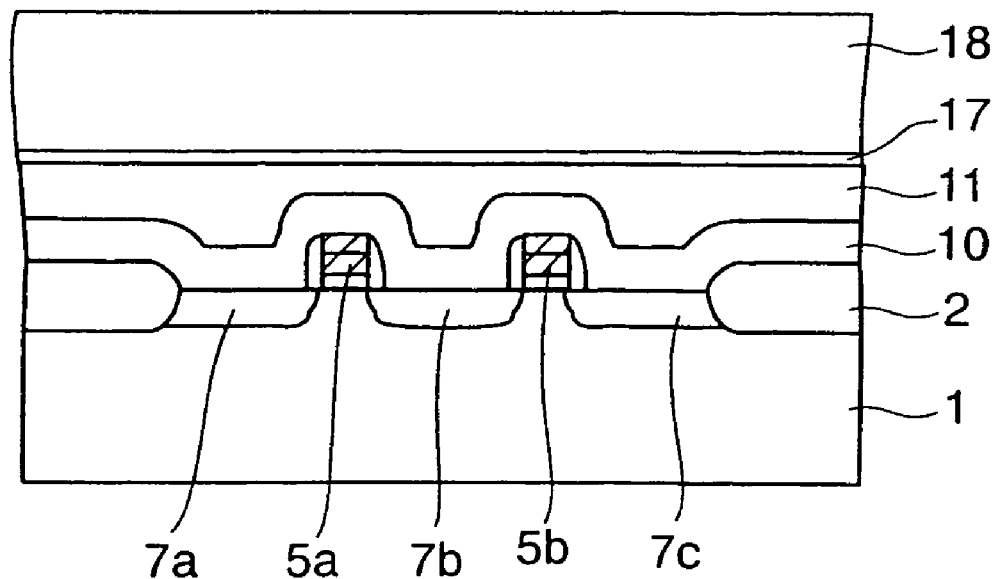
Figure 5F:
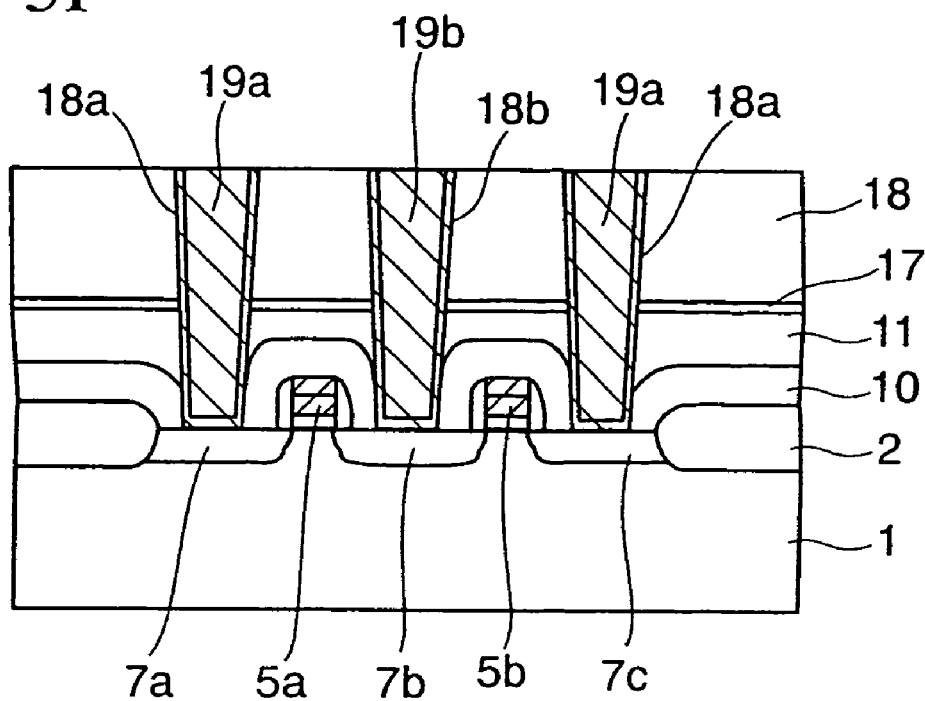
Figure 5G:
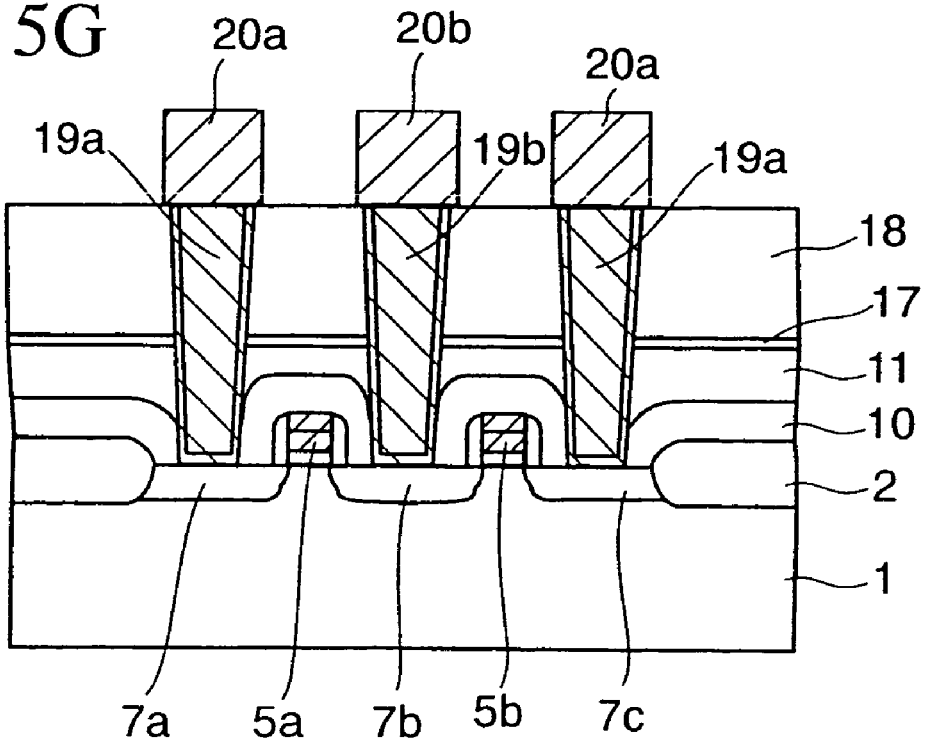
Figure 6A:
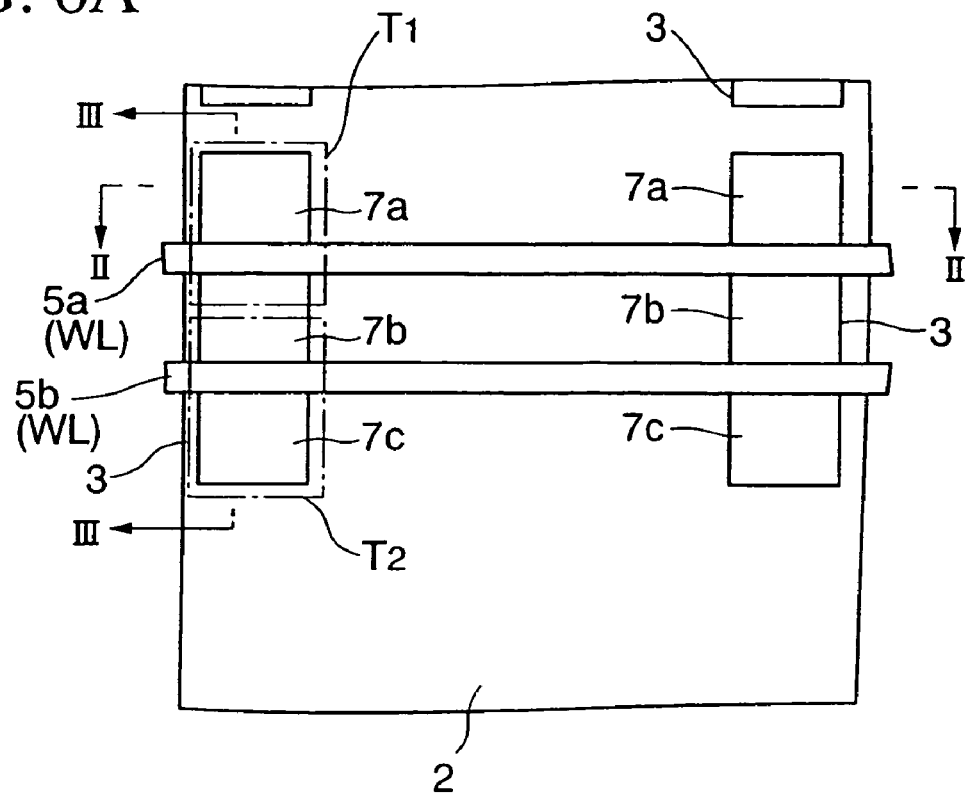
FIGS. 6A to 6H are plan views showing steps of forming a capacitor of the memory cell of the semiconductor device according to the first embodiment of the present invention.

In this case, FIGS. 4A to 4J are sectional views taken along a II-II line in FIG. 6A. Also, FIGS. 5A to 5G are sectional views taken along a III-III line in FIG. 6A.

Figure 1:
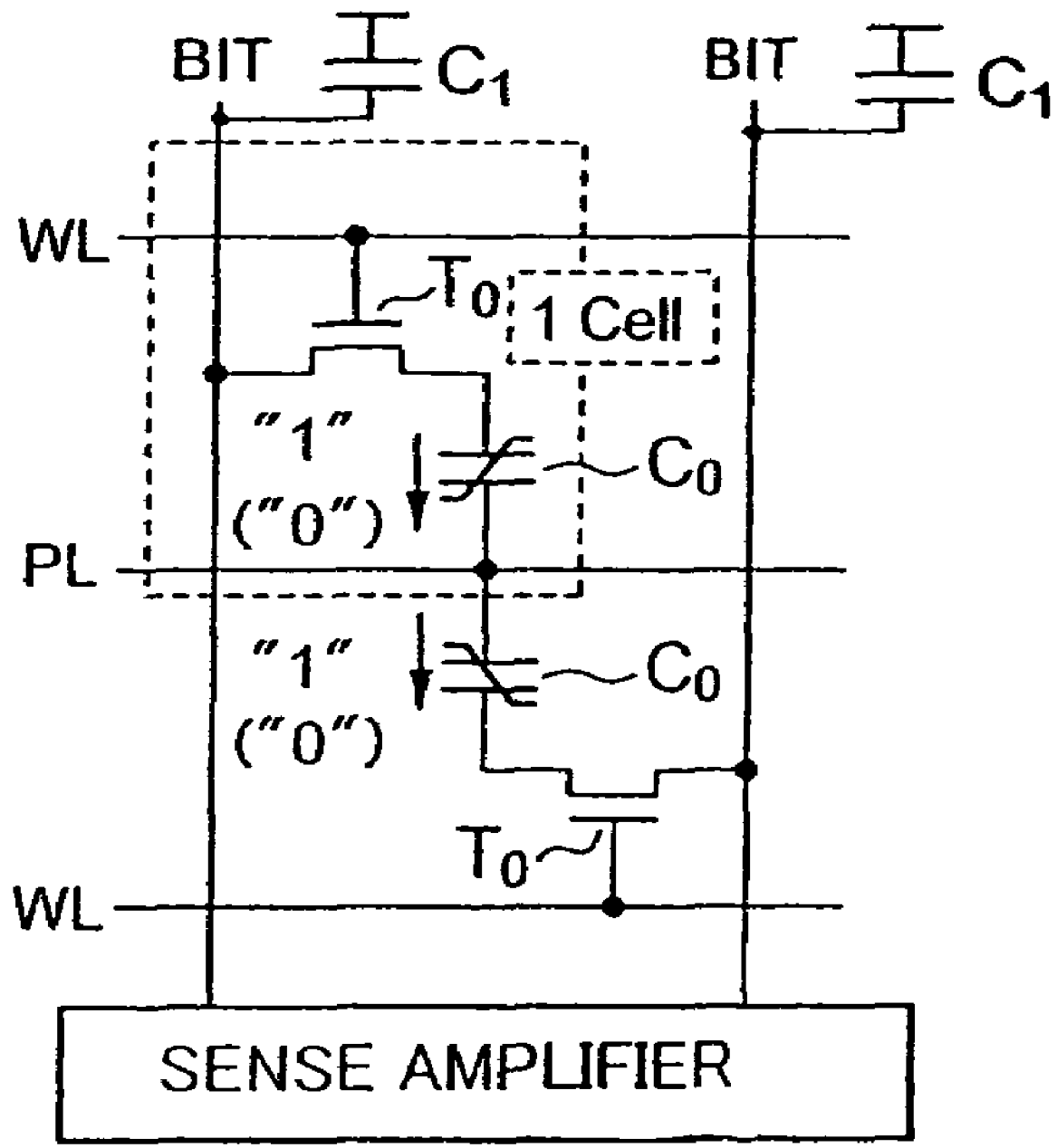
FIG. 1 is a circuit diagram showing a 1T1C-type memory cell of FeRAM.
Figure 2:
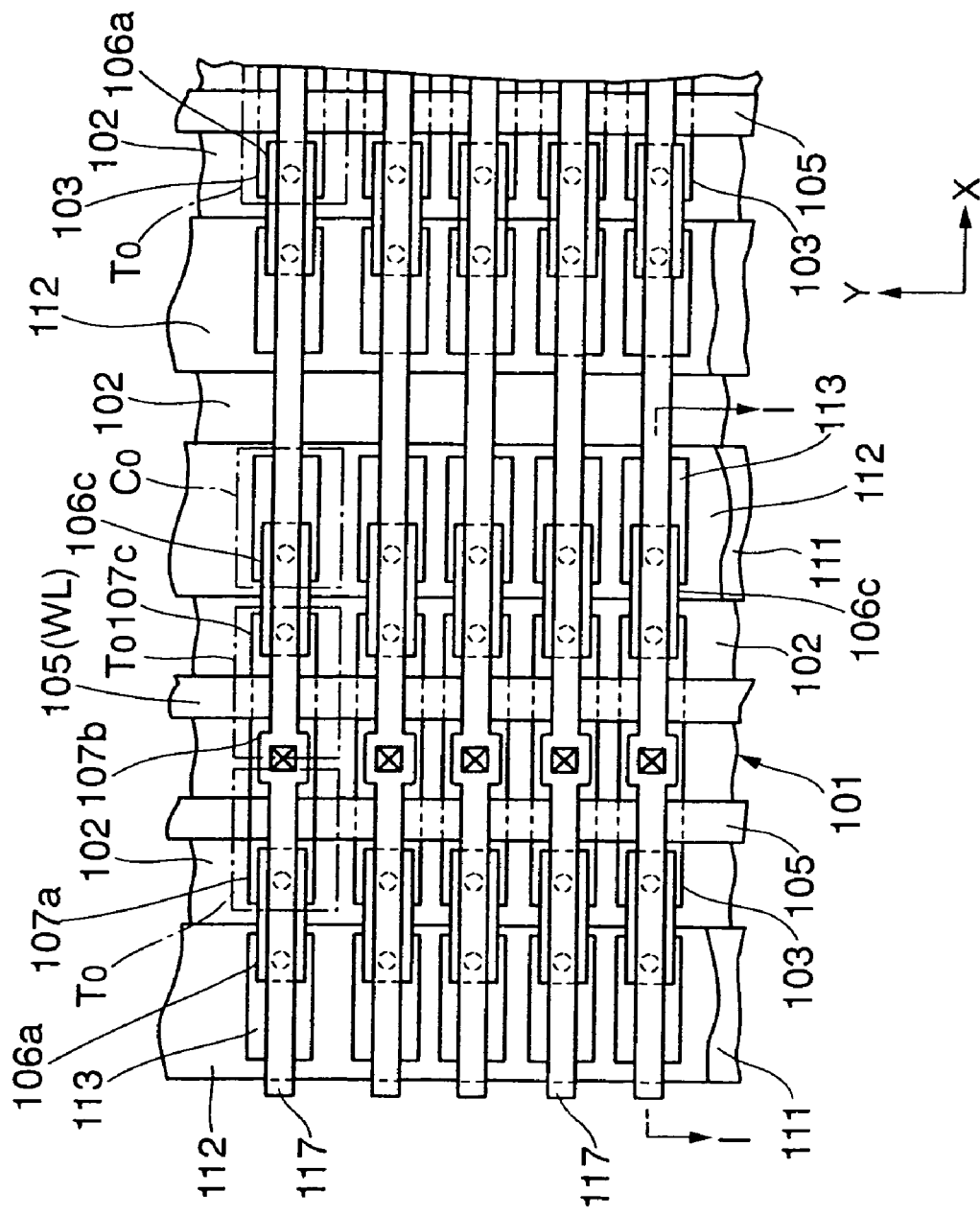
FIG. 2 is a plan view showing an FeRAM memory cell in the prior art.
Figure 3:
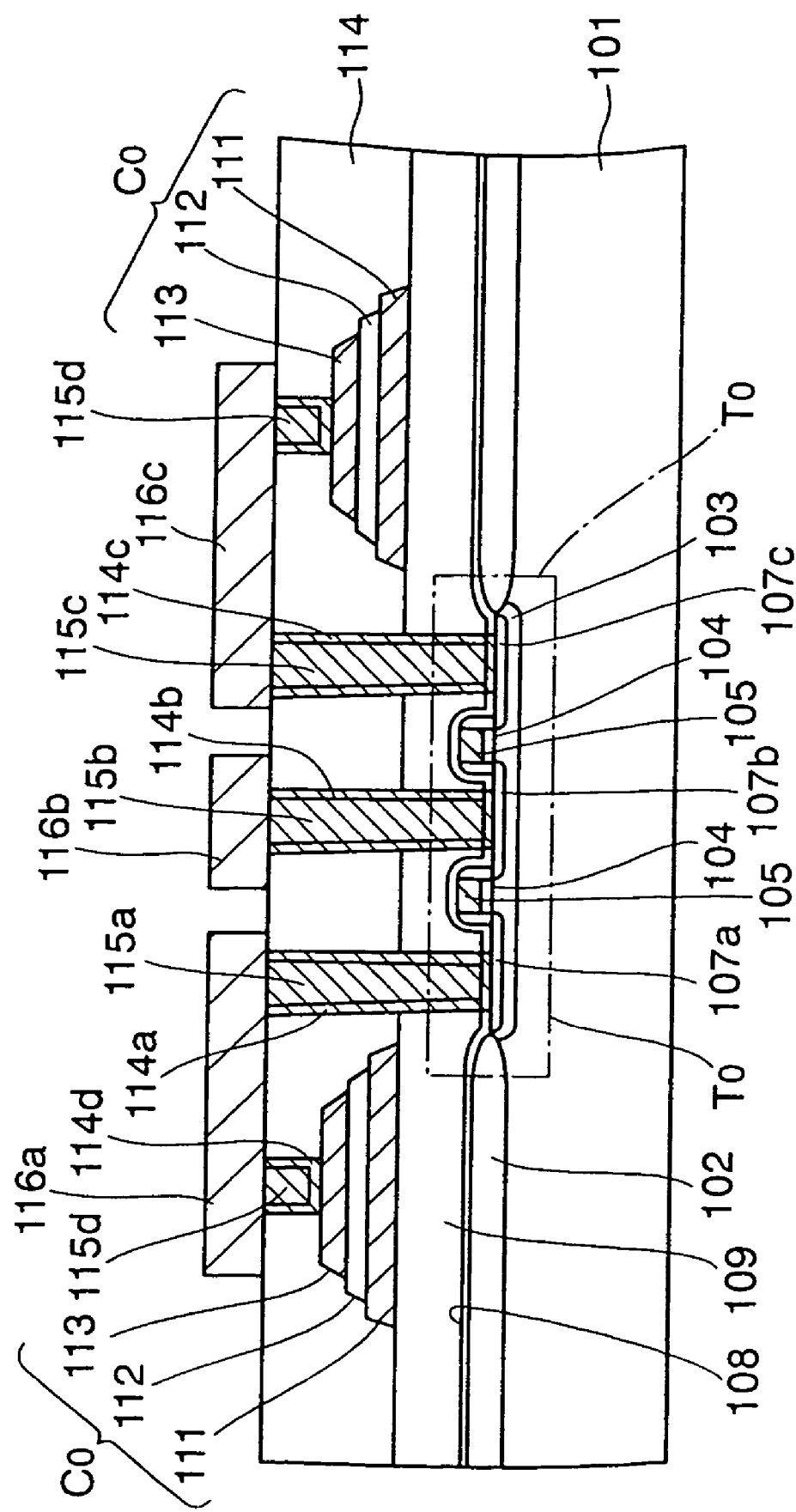
FIG. 3 is a sectional view showing the FeRAM memory cell in the prior art.
Figure 4A:
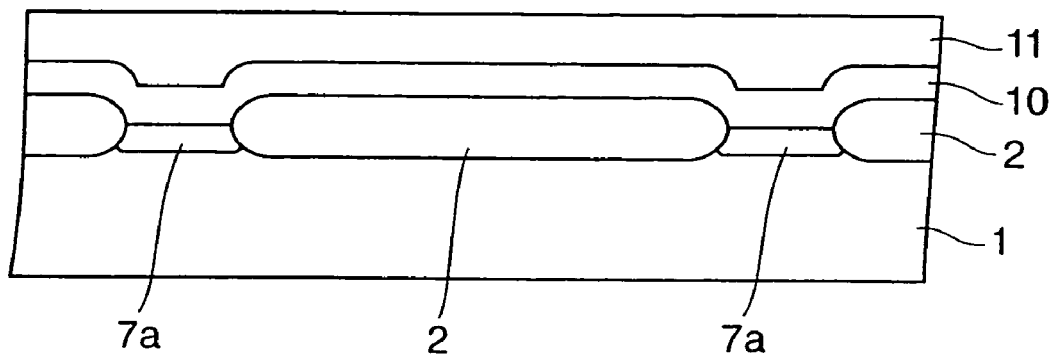
FIGS. 4A to 4J are sectional views showing steps of forming a capacitor of a memory cell of a semiconductor device according to a first embodiment of the present invention.

Next, steps required until structures shown in FIG. 4A, FIG. 5A, and FIG. 6A are formed will be explained hereunder.

First, an element isolation insulating film 2 is formed on a surface of a p-type silicon (semiconductor) substrate 1 by the LOCOS (Local Oxidation of Silicon) method. In this case, as the element isolation insulating film 2, the STI (Shallow Trench Isolation) structure may be employed in addition to the silicon oxide film formed by the LOCOS method. The element isolation insulating film 2 is formed in the range that surrounds a predetermined active region (transistor forming region) 3 in the memory cell region of the silicon substrate 1.

A planar shape of the active region 3 is an almost rectangle. A plurality of active regions 3 are formed along both sides of a stripe-like plate line forming region at an interval.

Then, a silicon oxide film that is used as a gate insulating film 4 on the active region 3 is formed by thermally oxidizing the surface of the silicon substrate 1.

Then, an amorphous silicon film and a tungsten silicide film are formed sequentially on the element isolation insulating film 2 and the gate insulating film 4. Then, gate electrodes 5a, 5b are formed on the active region 3 by patterning the amorphous silicon film and the tungsten silicide film into a predetermined shape by the photolithography method. Two gate electrodes 5a, 5b are formed on the active region 3 in the memory cell region in almost parallel at an interval. These gate electrodes 5a, 5b are extended onto the element isolation insulating film 2 to act as the word line WL. The word lines WL are formed to extend in the direction that intersects orthogonally with the extending direction of the plate line forming region.

In this case, a polysilicon film may be formed in place of the amorphous silicon film constituting the gate electrodes 5a, 5b.

Then, first to third n-type impurity diffusion regions 7a, 7b, 7c serving as the source/drain of n-channel MOS transistors $T_1$, $T_2$ are formed by ion-implanting the n-type impurity into the active region 3 on both sides of the gate electrodes 5a, 5b. The second n-type impurity diffusion region 7b positioned in the middle of the active region 3 is connected electrically to the bit line, while the first and third n-type impurity diffusion regions 7a, 7c positioned on both sides of the active region 3 are connected electrically to the capacitor.

Then, an insulating film is formed on the silicon substrate 1, the element isolation insulating film 2, and the gate electrodes 5a, 5b. Then, a sidewall insulating film 6 is formed on both side portions of the gate electrodes 5a, 5b by etching back the insulating film. A silicon oxide ($SiO_2$) formed by the CVD method, for example, is used as the insulating film.

Then, the n-type impurity is ion-implanted into the n-type impurity diffusion regions 7a, 7b, 7c by using the gate electrodes 5a, 5b and the sidewall insulating films 6 on the active region 3 as a mask, whereby the n-type impurity diffusion regions 7a, 7b, 7c are formed into the LDD structure.

Accordingly, formation of the first nMOS transistor $T_1$ having the first and second n-type impurity diffusion regions 7a, 7b and the gate electrode 5a and formation of the second nMOS transistor $T_2$ having the second and third n-type impurity diffusion regions 7b, 7c and the gate electrode 5b are completed.

Then, a cover film 10 for covering the nMOS transistors $T_1$, $T_2$ is formed on the silicon substrate 1 by the plasma CVD method. As the cover film 10, a silicon oxide nitride (SiON) film, for example, is formed.

Then, a silicon oxide ($SiO_2$) film is grown up to a thickness of about 1.0 µm by the plasma CVD method using the TEOS gas. This silicon oxide film is used as a first interlayer insulating film 11.

In turn, as the densifying process of the first interlayer insulating film 11, this first interlayer insulating film 11 is annealed at the temperature of 700° C. for 30 minutes at the atmospheric pressure in the nitrogen atmosphere. Then, an upper surface of the first interlayer insulating film 11 is polished and planarized by the CMP (Chemical Mechanical Polishing) method.

In this case, in FIG. 6A, an insulating film formed on the element isolation insulating film 2 is omitted from illustration.

Figure 4B:
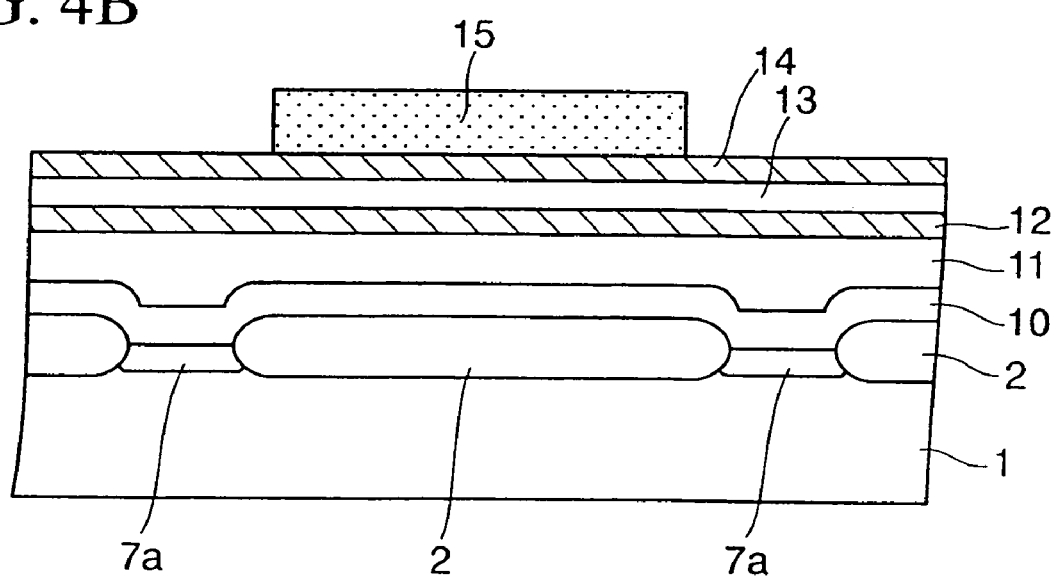
Figure 6B:
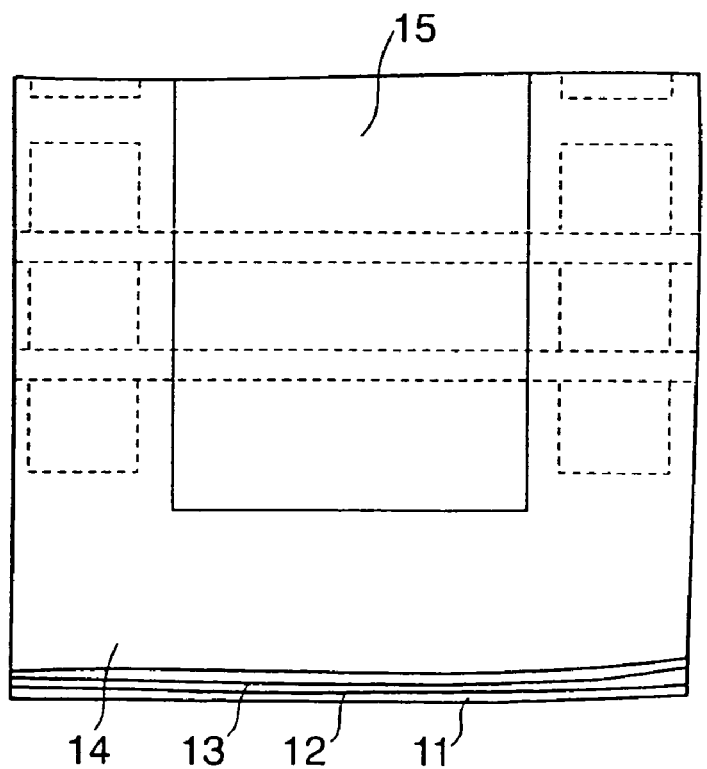

Next, steps required until structures shown in FIG. 4B, FIG. 5B, and FIG. 6B are formed will be explained hereunder.

First, a Ti film and a platinum (Pt) film are formed sequentially as a first conductive film 12 on the first interlayer insulating film 11. The Ti film and the Pt film are formed by the DC sputter method. In this case, a thickness of the Ti film is set to about 10 to 30 nm and a thickness of the Pt film is set to about 100 to 300 nm. In this case, as the first conductive film 12, a conductive film made of any one of iridium, ruthenium, ruthenium oxide, iridium oxide, strontium ruthenium oxide ($SrRuO_3$), etc. may be formed.

Then, a plumbum zirconate titanate (PZT; $Pb(Zr_{1-x}Ti_x)O_3$) film of 100 to 300 nm thickness is formed as a ferroelectric film 13 on the first conductive film 12 by the RF sputter method. As the method of forming the ferroelectric film 13, there are the MOD (Metal Organic Deposition) method, the MOCVD (Metal Organic CVD) method, the sol-gel method, etc. in addition to the above method. Also, as the material of the ferroelectric film 13, other PZT material such as PLCSZT, PLZT, etc., a Bi-layered structure compound such as $SrBi_2Ta_2O_9$ (SBT, Y1), $SrBi_2(Ta, Nb)_2O_9$ (SBTN, YZ), etc., and other metal oxide ferroelectric substances may be employed in addition to PZT.

In addition, as the crystallizing process of the PZT film constituting the ferroelectric film 13, RTA (Rapid Thermal Annealing) is carried out at the temperature of 650 to 850° C. for 30 to 120 seconds in the oxygen atmosphere. For example, the PZT film is annealed at the temperature of 700° C. for 60 seconds.

Then, an iridium oxide ($IrO_2$) film of 100 to 300 nm thickness is formed as a second conductive film 14 on the ferroelectric film 13 by the sputter method. In this case, as the second conductive film 14, platinum or strontium ruthenium oxide (SRO) may be employed.

Then, a first resist pattern 15 is formed on the plate line forming region except a plate line contact region by coating a resist on the second conductive film 14 and then exposing/developing it.

Figure 4C:
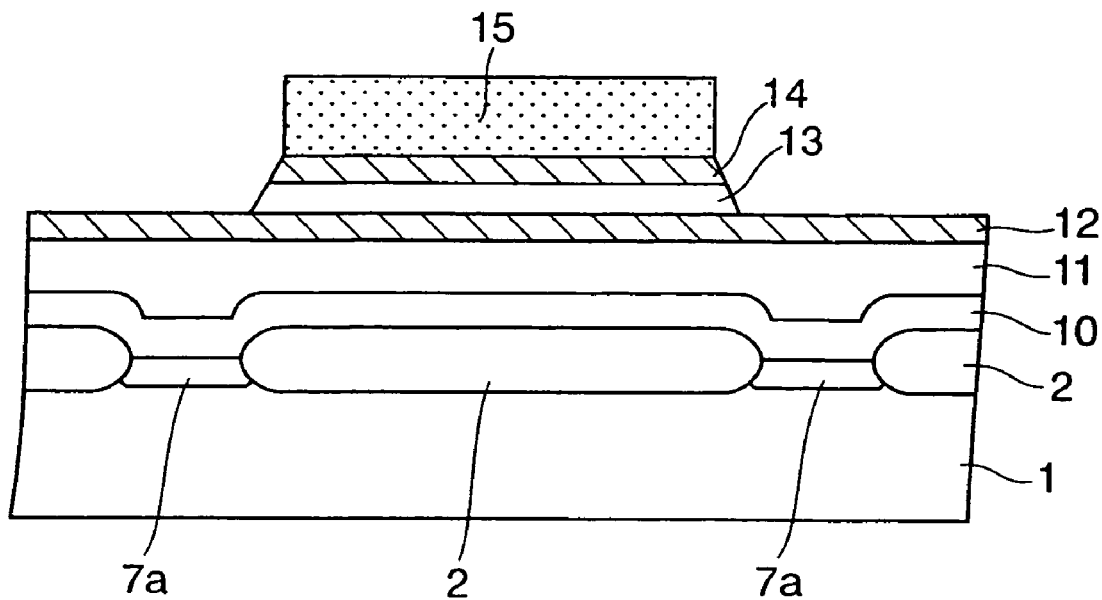
Figure 6C:
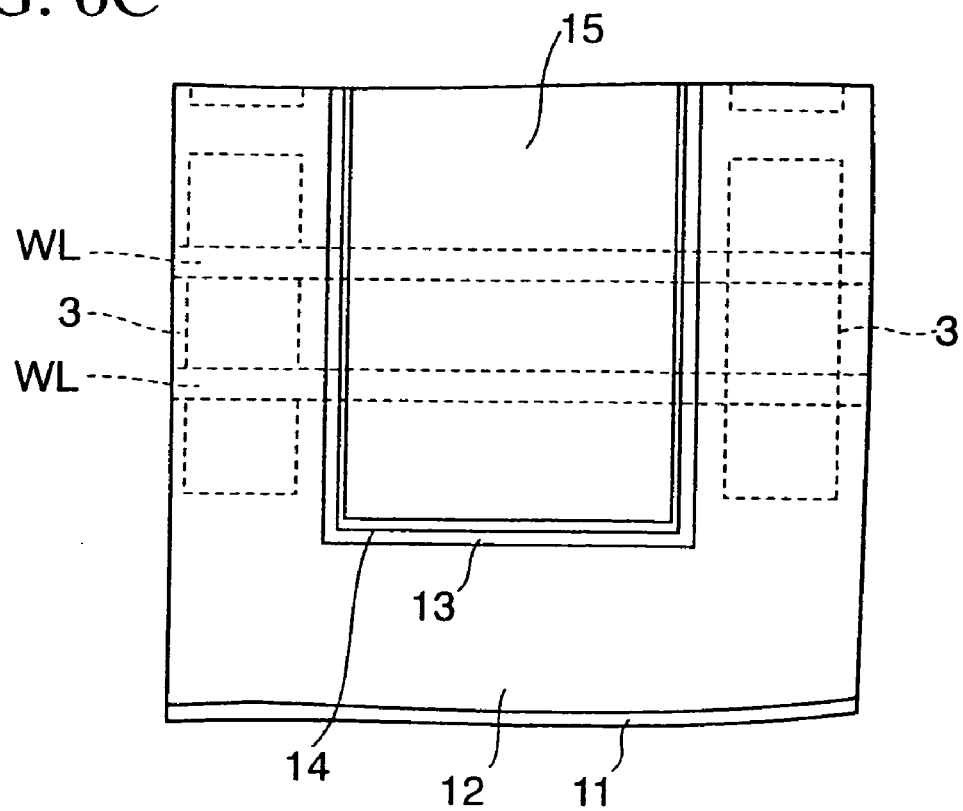

Next, as shown in FIG. 4C, FIG. 5C, and FIG. 6C, the second conductive film 14 and the ferroelectric film 13 are etched by using the first resist pattern 15 as a mask. Accordingly, the second conductive film 14 and the ferroelectric film 13 are shaped into the same shape as the plate line forming region except the plate line contact region, and are removed from upper surfaces of the nMOS transistors $T_1$, $T_2$. A width of the plate line forming region is set to about 2.9 µm.

As the etching conditions in this case, for example, the inductively coupled plasma etching equipment is employed, a chlorine ($Cl_2$) gas and an argon (Ar) gas are introduced into the etching atmosphere at 20 ml/min and 30 ml/min respectively, and a degree of vacuum in the etching atmosphere is set to 0.7 Pa. In addition, the temperature of the wafer stage on which the silicon substrate 1 is loaded is set to 25° C., the source power is set to 1400 W, and the bias power is set to 800 W. In this case, the source power is the high-frequency power that has 13.56 MHz and is applied to the antenna coil of the inductively coupled plasma etching equipment. Also, the bias power is the high-frequency power that has 400 kHz and is applied to the wafer stage.

If the conductive etching product adheres to side surfaces of the first resist pattern 15, the second conductive film 14, and the ferroelectric film 13 during the etching, the leakage current is ready to flow between the capacitor upper electrode and the capacitor lower electrode, which are formed thereafter by patterning the first and second conductive films 12, 14. Therefore, it is preferable that the etching should be executed to scrape the conductive material, which adheres to side surfaces of the first resist pattern 15 and side surfaces of the etched film, off constantly by setting the etching conditions that cause the side surfaces of the first resist pattern 15 to retreat in the lateral direction. In this case, the retreat of side surfaces of the first resist patterns 15 is expedited, and control of this retreat is executed by adjusting flow rates of the chlorine gas and the argon gas. For example, a ratio of the chlorine gas is set high and a ratio of the argon gas is set low.

Figure 4D:
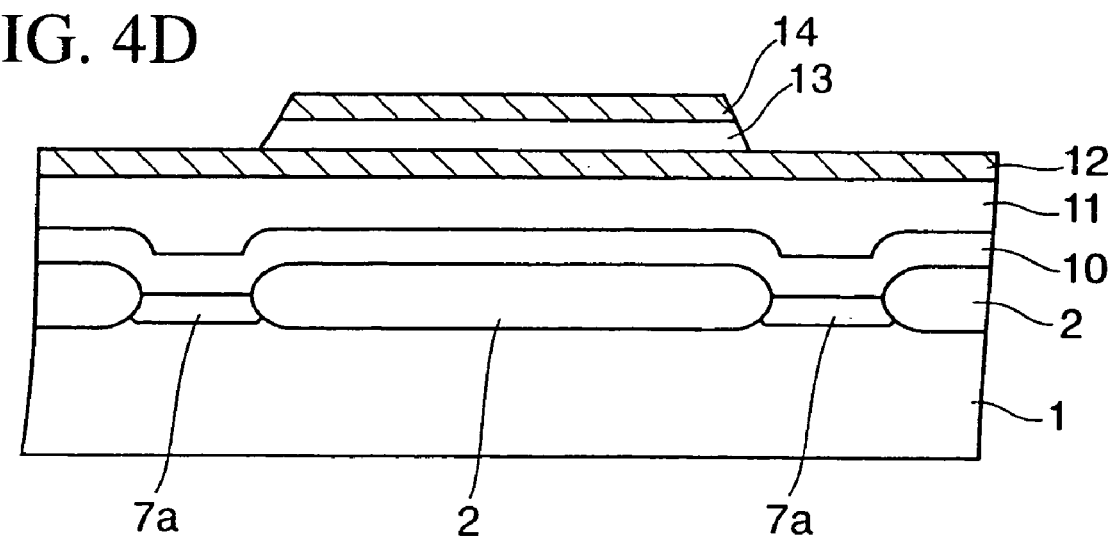
Figure 6D:
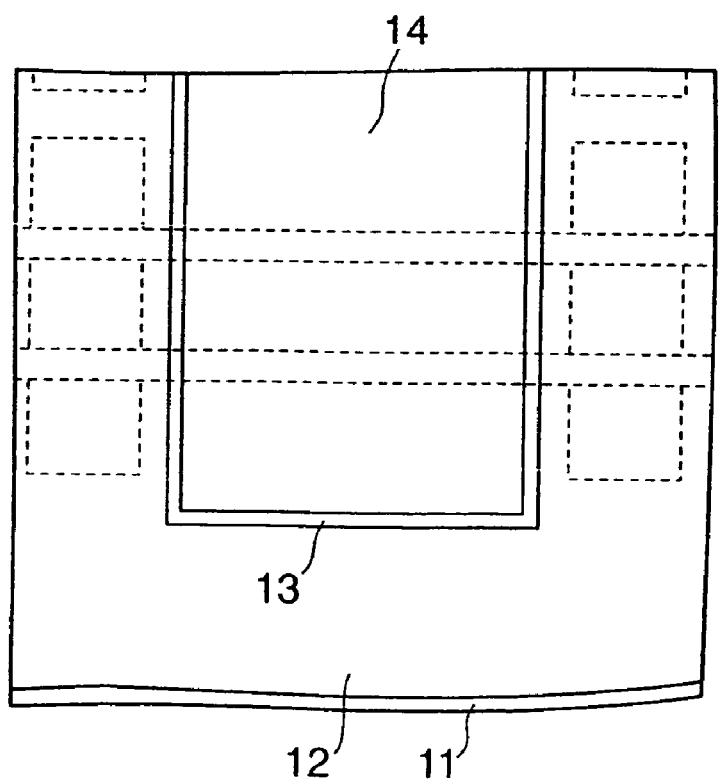

Then, as shown in FIG. 4D and FIG. 6D, the first resist pattern 15 is removed.

Figure 4E:
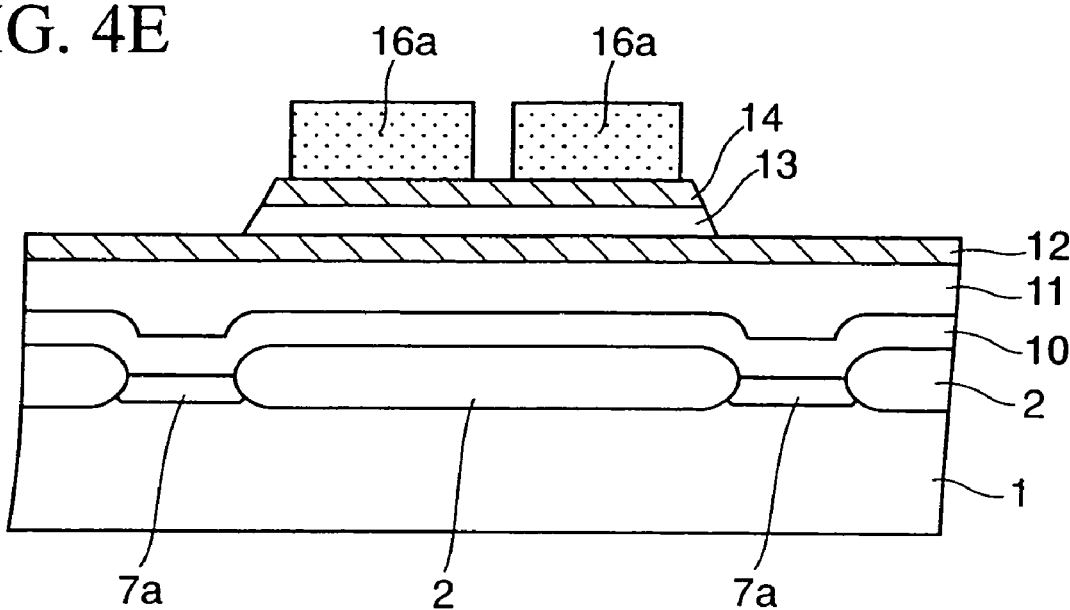
Figure 6E:
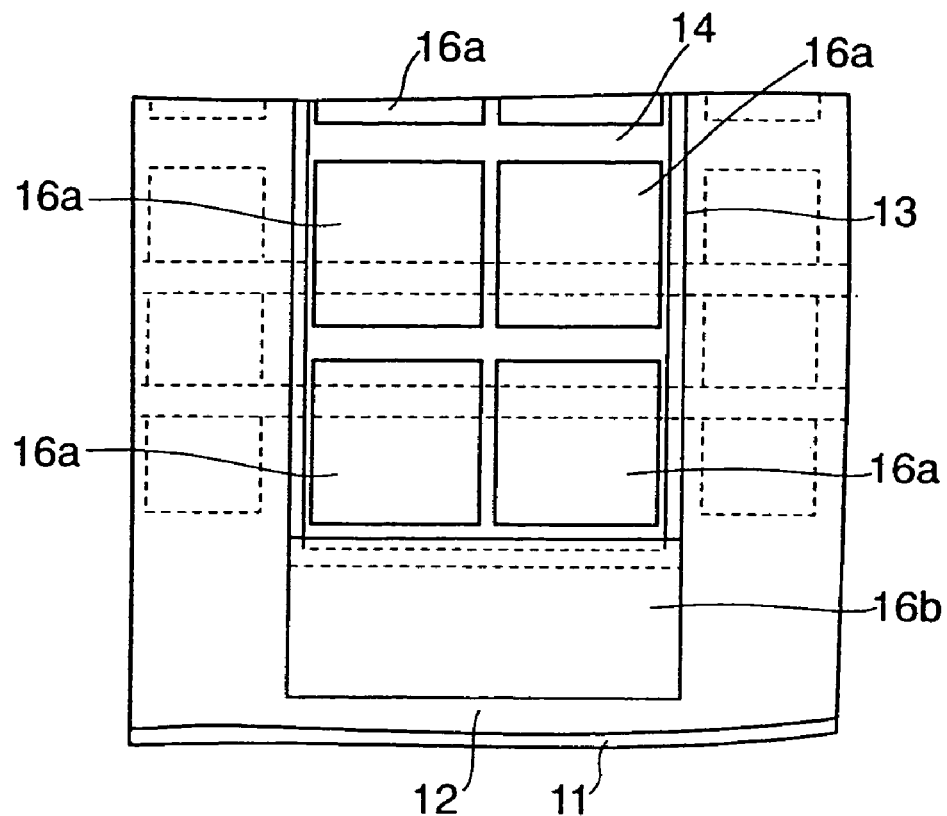

Then, a resist is coated on the first and second conductive films 12, 14 and the ferroelectric film 13. Then, the resist is exposed/developed. Thus, as shown in FIG. 4E and FIG. 6E, the second resist patterns 16a each having a shape of the capacitor upper electrode, which has a width of 1.0 µm and a length of 1.7 µm, are formed over the second conductive film 14 that is present in the plate line forming region, and also a third resist pattern 16b having an area that overlaps slightly with the end portion of the second conductive film 14 from the plate line contact region is formed. This overlapping area is set to an amount to take account of displacement in the plate line contact region in the alignment. The second resist patterns 16a are formed in plural in two columns along the length direction of the plate line forming region. An interval between the second resist patterns 16a is set to 0.3 µm, for example.

Figure 4F:
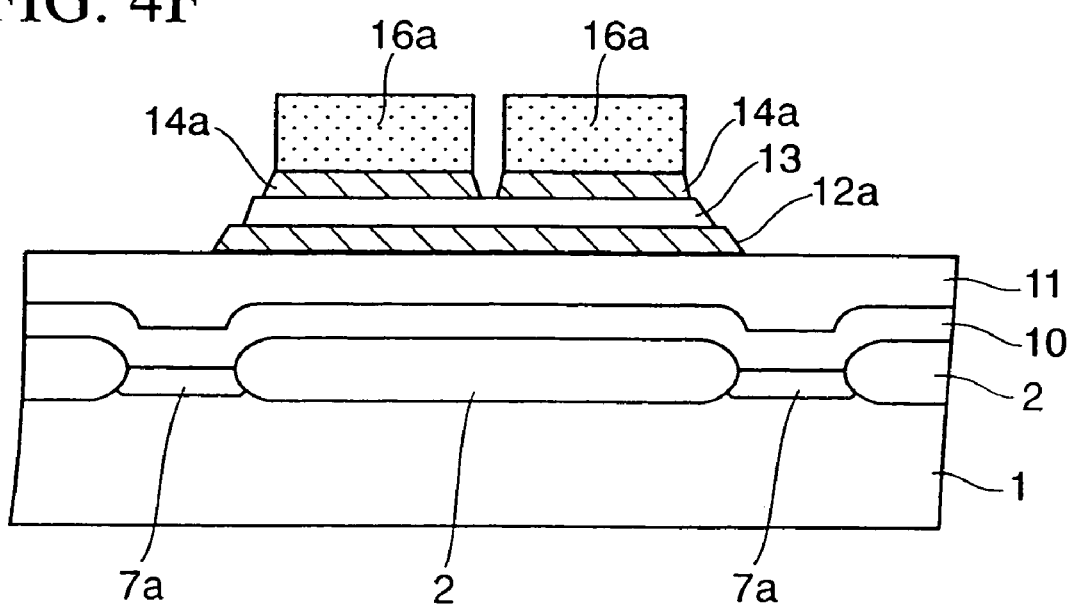
Figure 6F:
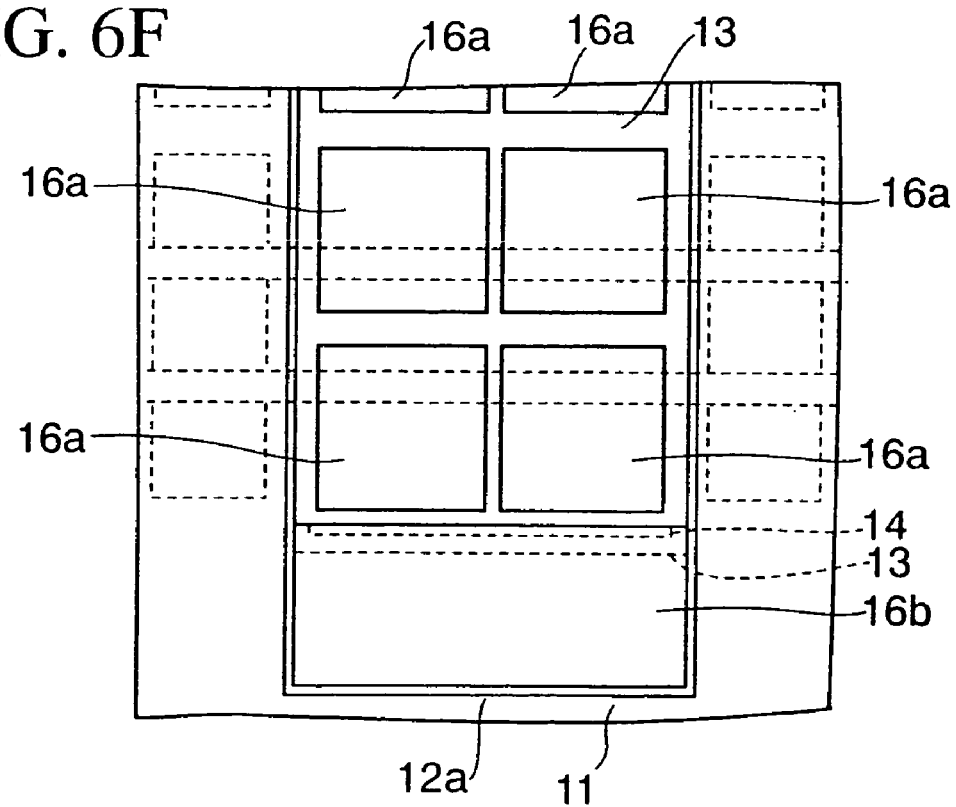

Then, as shown in FIG. 4F and FIG. 6F, the second conductive film 14 in the region that is not covered with the second resist patterns 16a is etched and simultaneously the first conductive film 12 in the region that is not covered with the third resist pattern 16b and the ferroelectric film 13 is etched.

Accordingly, the first conductive film 12 is patterned into the plate line as a capacitor lower electrode 12a. Also, the second conductive film 14 is patterned into plural upper electrodes 14a that are aligned in two columns over each plate line 12a and is left as an isolated conductive pattern 14b on the stripe-like ferroelectric film 13 at the boundary portion to the plate line contact region. Also, as shown in FIG. 5D and FIG. 6F, the first conductive film 12 is removed from upper areas of the MOS transistors $T_1$, $T_2$.

In this case, the etching conditions of the first and second conductive films 12, 14, are set such that the ferroelectric film 13 in the plate line region is left near the upper electrodes 14a. Also, the etching conditions must be set in response to respective film thicknesses of the first conductive film 12 and the second conductive film 14 such that the upper electrodes 14a and the lower electrode 12a can be formed at the same time. In addition, the leakage current between the upper electrodes 14a and the lower electrode 12a must be prevented by setting the etching conditions that cause the conductive substance not to adhere to side walls of the upper electrodes 14a, the ferroelectric film 13, and the lower electrode 12a.

As such etching conditions, for example, the inductively coupled plasma etching equipment is employed, the chlorine ($Cl_2$) gas and the argon (Ar) gas are introduced into the etching atmosphere at 20 ml/min and 30 ml/min respectively, and a degree of vacuum in the etching atmosphere is set to 0.7 Pa. In addition, the temperature of the wafer stage on which the silicon substrate 1 is loaded is set to 25° C., the source power is set to 1400 W, and the bias power is set to 800 W.

Since the first conductive film 12 and a part of the second conductive film 14 are etched simultaneously by this etching, the upper electrodes 14a and the lower electrodes 12a of the capacitors Q are formed simultaneously.

Accordingly, the capacitors Q each having the lower electrode 12a, the ferroelectric film 13, and the upper electrode 14a are formed in the memory cell region. That is, the capacitors Q are formed in the plate line forming region as many as the upper electrodes 14a.

In this case, the ferroelectric film 13 and the lower electrodes 12a are also present under the isolated conductive pattern 14b. However, since the isolated conductive pattern 14b is put in the electrically-isolated state, such isolated conductive pattern 14b is never operated as the upper electrode of the capacitor.

Figure 4G:
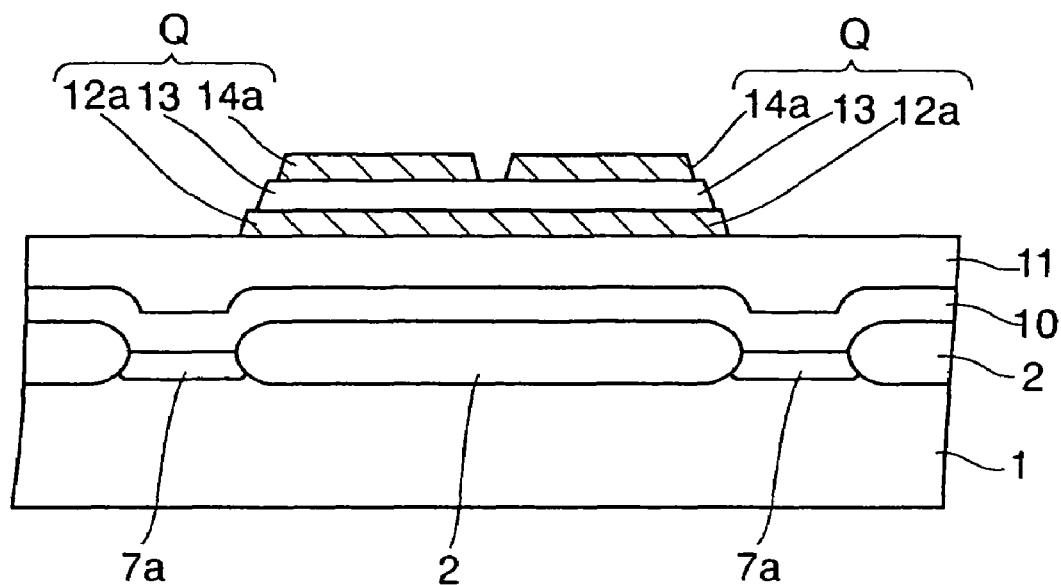
Figure 6G:
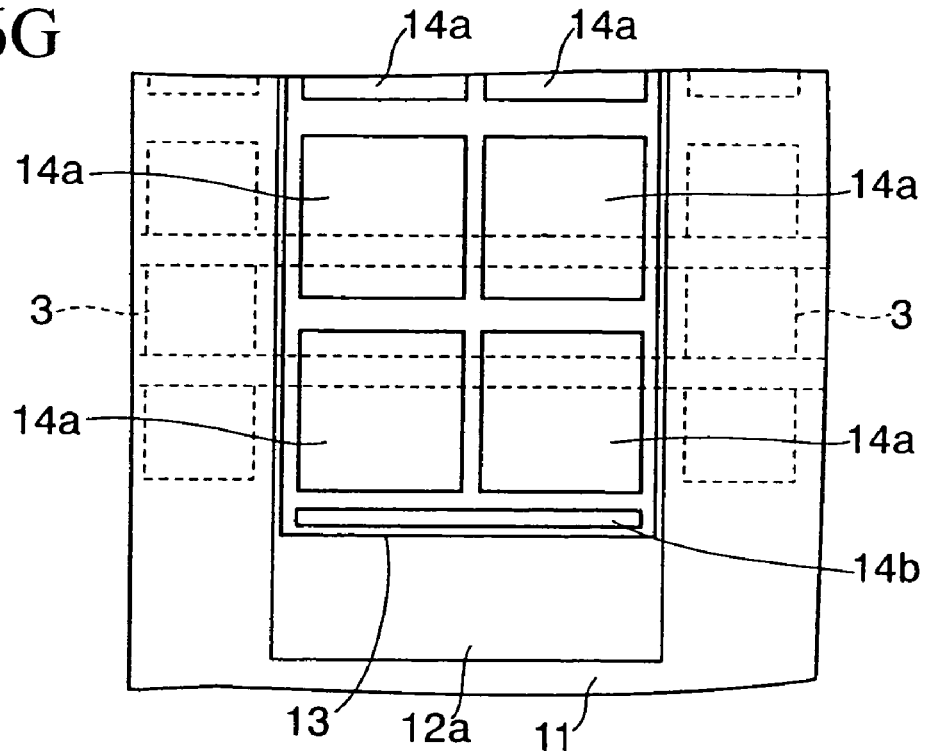

Then, as shown in FIG. 4G and FIG. 6G, the second and third resist patterns 16a, 16b are removed.

Figure 4H:
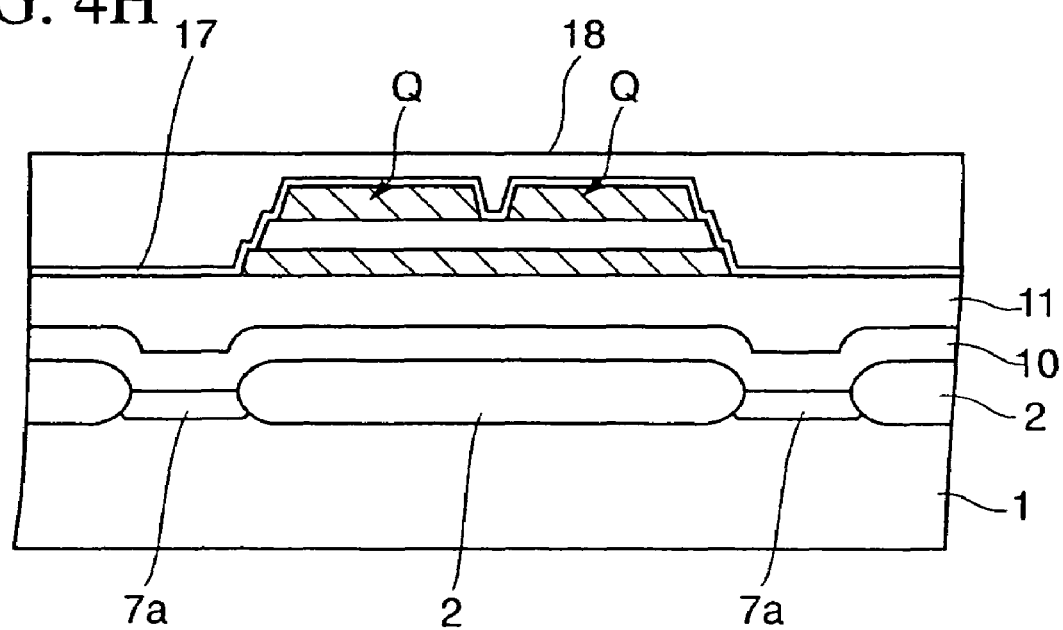

Then, as shown in FIG. 4H and FIG. 5E, alumina of about 20 nm thickness, for example, is formed as a capacitor protection insulating film 17 on the capacitors Q and the first interlayer insulating film 11. In this case, as the capacitor protection insulating film 17, a PZT film, a silicon nitride film, a silicon oxide nitride film, or the like may be applied in addition to the alumina.

In addition, a silicon oxide film of about 1 μm thickness is formed as a second interlayer insulating film 18 on the capacitor protection insulating film 17. This silicon oxide film is formed by the CVD method while using a mixed gas consisting of TEOS, helium and oxygen.

Then, an upper surface of the second interlayer insulating film 18 is planarized by the CMP method. In this example, a remaining film thickness of the second interlayer insulating film 18 together with a film thickness of the capacitor protection insulating film 17 is set to about 300 nm on the capacitors Q in the memory cell region A after the CMP is applied.

Figure 4I:
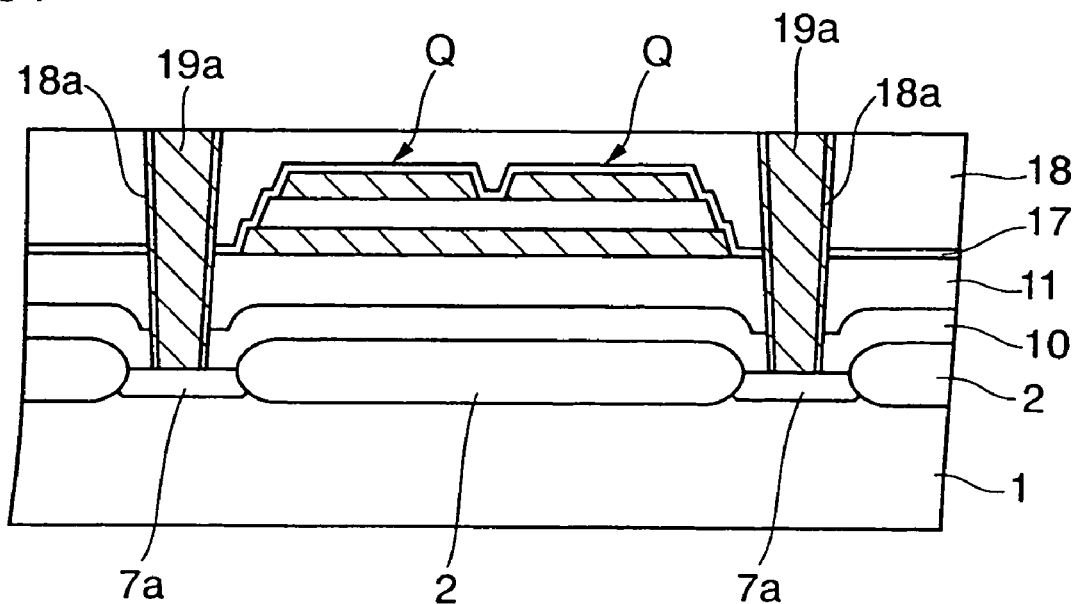

Next, steps required until structures shown in FIG. 4I and FIG. 5F are formed will be explained hereunder.

First, the second interlayer insulating film 18, the capacitor protection insulating film 17, the first interlayer insulating film 11, and the cover film 10 are patterned by the photolithography method. Thus, capacitor contact holes 18a are formed on the first and third n-type impurity diffusion regions 7a, 7c respectively and at the same time a bit-line contact hole 18b is formed on the second n-type impurity diffusion region 7b.

Then, a Ti film of 20 nm thickness and a TiN film of 50 nm thickness are formed sequentially on the second interlayer insulating film 18 and in the capacitor contact holes 18a and the bit-line contact hole 18b by the sputter, and then a W film is formed on the TiN film by the CVD method. The W film is formed to have a thickness that bury perfectly the capacitor contact holes 18a and the bit-line contact hole 18b.

Then, the Ti film, the TiN film, and the W film are removed from an upper surface of the second interlayer insulating film 18 by polishing them by virtue of the CMP method. Accordingly, the Ti film, the TiN film, and the W film left in the capacitor contact holes 18a are used as first conductive plugs 19a for capacitor contacts, while the Ti film, the TiN film, and the W film left in the bit-line contact hole 18b are used as a second conductive plug 19b for a bit-line contact.

Figure 4J:
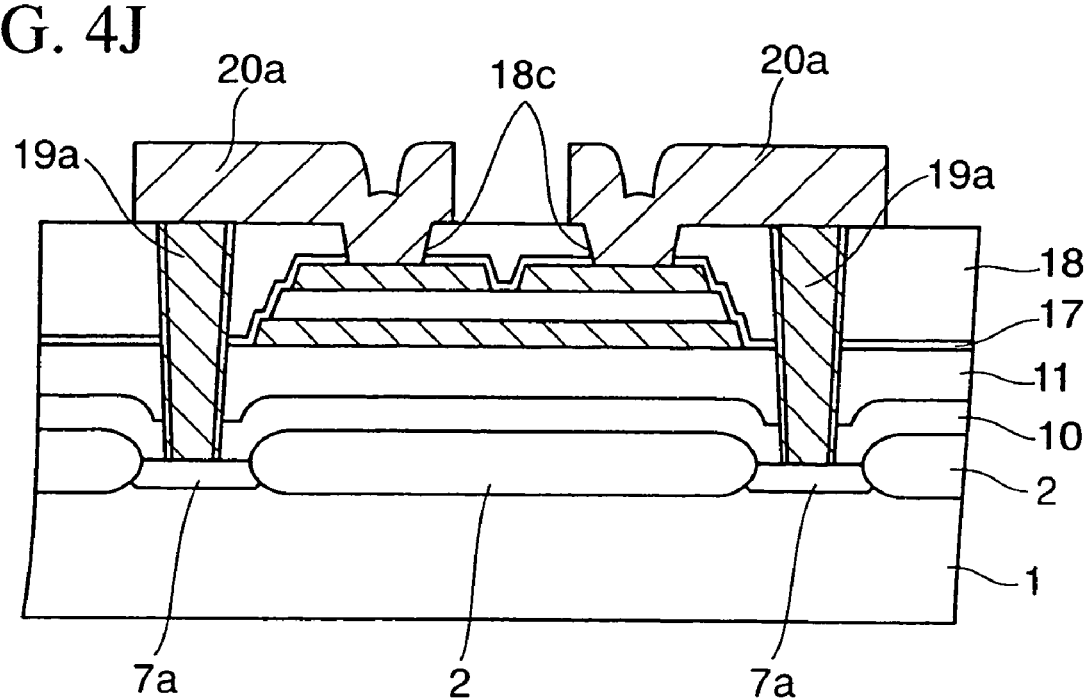
Figure 6H:
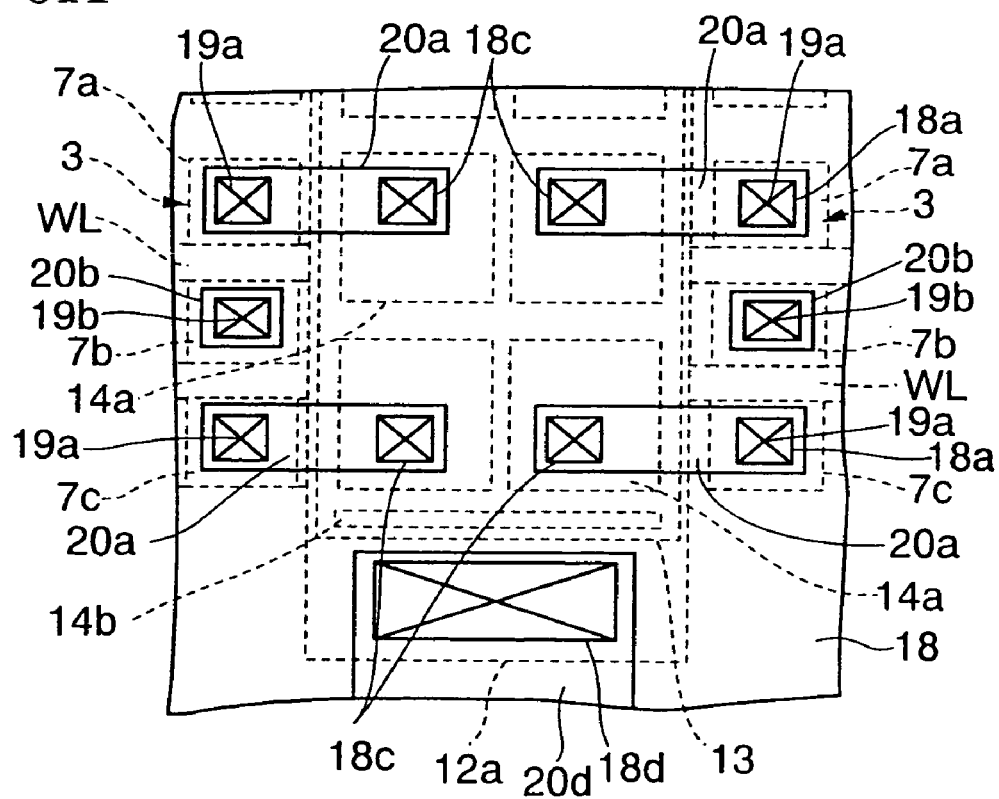

Next, steps required until structures shown in FIG. 4J, FIG. 5G, and FIG. 6H are formed will be explained hereunder.

First, an oxidation preventing insulating film (not shown) made of alumina or the like is formed on the second interlayer insulating film 18 and the first and second conductive plugs 19a, 19b. Then, capacitor contact holes 18c are formed on the upper electrodes 14a by patterning the oxidation preventing insulating film, the second interlayer insulating film 18, and the capacitor protection insulating film 17. At the same time, a plate line contact hole 18d is formed on the plate line contact region of the plate line 12a by patterning the second interlayer insulating film 18 and the capacitor protection insulating film 17.

Then, the oxidation preventing insulating film is removed by the etching back. Then, a metal film having a five-layered structure consisting of a TiN film of 150 nm thickness, a Ti film of 5 nm thickness, an Al—Cu film of 500 nm thickness, a TiN film of 50 nm thickness, and a Ti film of 20 nm thickness is formed as a wiring metal film on the second interlayer insulating film 18 and the first and second conductive plugs 19a, 19b and in the contact holes 18c, 18d. Then, the wiring metal film is patterned by the photolithography method.

According to this patterning of the wiring metal film, first wirings 20a for connecting electrically the contact holes 18c on the upper electrodes 14a and the first conductive plugs 19a on the sides thereof are formed and also a second wiring 20d connected to the plate line 12a via the contact hole 18d on the plate line contact region is formed. At the same time, conductive pads 20b are formed on the second conductive plugs 19b are formed.

Accordingly, the upper electrodes 14a of the capacitors Q formed on the plate line 12a in two columns and the first or third n-type impurity diffusion regions 7a, 7c are connected electrically mutually via the first wirings 20a and the first conductive plugs 19a.

In this case, the second n-type impurity diffusion region 7b is connected electrically to the bit line (not shown) formed over this region via the conductive pad 20b and the second conductive plug 19b.

After the wirings 20a, 20d and the conductive pads 20b are formed, a third interlayer insulating film is formed thereon, then conductive plugs are formed, and then the bit lines, etc. are formed on the third interlayer insulating film. But explanation of their details is omitted herein.

In the above embodiment, a plurality of upper electrodes 14a are formed on the ferroelectric film 13, which covers the plate line 12a serving as the lower electrode of the capacitors Q, in two columns in the extending direction of the plate line 12a. Therefore, unlike the prior art employing a plurality of plate lines (lower electrodes) that are mounted in one column, the MOS transistors $T_1$, $T_2$ can be formed on both sides of the plate line 12a. As a result, useless spaces between the plate lines can be reduced rather than the prior art, and also the memory cell region can be integrated more highly than the prior art.

Also, in the steps of forming the capacitors Q by patterning the first conductive film 12, the ferroelectric film 13, and the second conductive film 14, the first conductive film 12 and the ferroelectric film 13 are patterned by using the same mask to leave in the plate line forming region and then the upper electrodes 14a and the plate lines (lower electrodes) 12a are simultaneously formed in two columns by patterning the second conductive film 14 and the first conductive film 12 at the same time.

Therefore, since the capacitors Q can be formed by two patterning steps, the throughput can be improved. In addition, the platinum constituting the plate line 12a is never exposed from the regions between the upper electrodes 14a and thus influence of the reducing action of the platinum catalyst on the capacitors Q is prevented.

Meanwhile, the pattern of the second conductive film 14 shown in FIG. 4D is used as a first pattern and the upper electrodes 14a shown in FIG. 4F are used as second patterns. When positional displacement of the second patterns with respect to the first pattern is caused, the condition required to keep sizes of the second patterns in left and right columns constant is given by a following inequality (1). In this inequality (1), $W_{TE-1st}$ is a width of the first pattern, $W_{TE-FINAL}$ is a width of the second pattern (upper electrode), $W_{ALLIGN}$ is a maximum amount of positional displacement, and $W_{TE-GAP}$ is an interval between the second patterns (upper electrodes) in two columns in the plate line forming region.

$$W_{TE-1st} > 2 \times (W_{TE-FINAL} + W_{ALLIGN}) + W_{TE-GAP} \qquad (1)$$

Second Embodiment

In the present embodiment, a method of narrowing an exposed area of a plate line contact region in the capacitor manufacturing steps will be explained hereunder.

FIGS. 7A to 7G are plan views showing steps of forming a capacitor of a memory cell of a semiconductor device according to a second embodiment of the present invention. FIGS. 8A to 8G are sectional views showing steps of forming the capacitor of the memory cell of the semiconductor device according to the second embodiment of the present invention. In this case, FIGS. 8A to 8G are sectional views taken along a IV-IV line in FIG. 7A.

First, as shown in FIG. 4A, FIG. 5A, and FIG. 6A according to the first embodiment, the element isolation insulating film 2, the MOS transistors $T_1$, $T_2$, the cover film 10, the first interlayer insulating film 11, etc. are formed on the silicon substrate 1.

Then, the first conductive film 12, the ferroelectric film 13, and the second conductive film 14 are formed in sequence on the first interlayer insulating film 11. The first conductive film 12, the ferroelectric film 13, and the second conductive film 14 are made of the materials shown in the first embodiment respectively. In this case, the ferroelectric film 13 is annealed to crystallize after the film formation.

Then, a first resist pattern 21 having a plate line (lower electrode) shape is formed by coating a resist on the second conductive film 14 and then exposing/developing it. The first resist pattern 21 has an opening 21a in the plate line contact portion.

In this case, FIGS. 8A to 8G show the plate line contact region and its periphery.

Figure 7A:
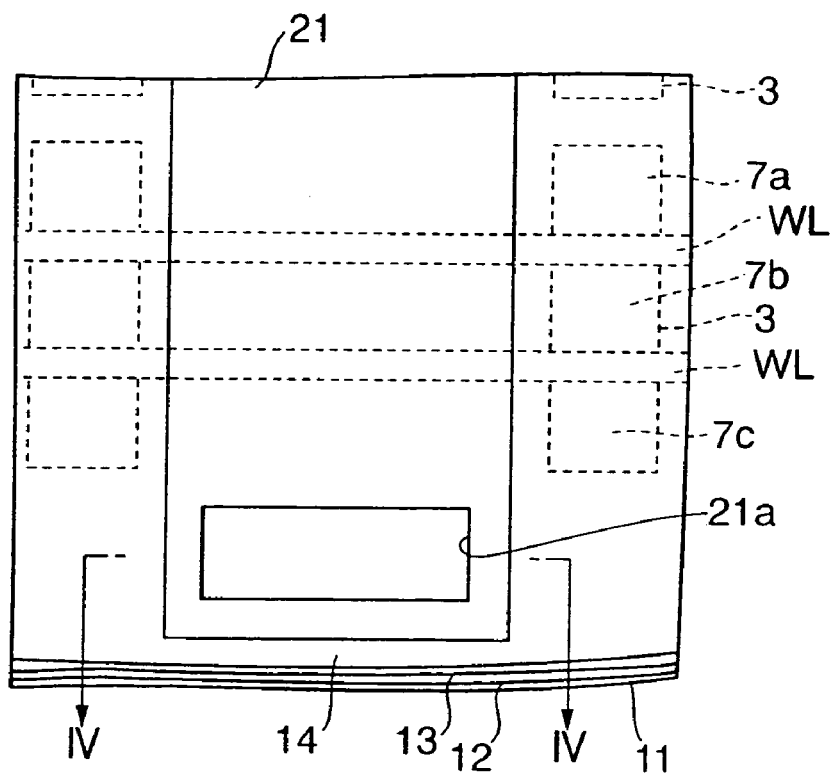
FIGS. 7A to 7G are plan views showing steps of forming a capacitor of a memory cell of a semiconductor device according to a second embodiment of the present invention.
Figure 7B:
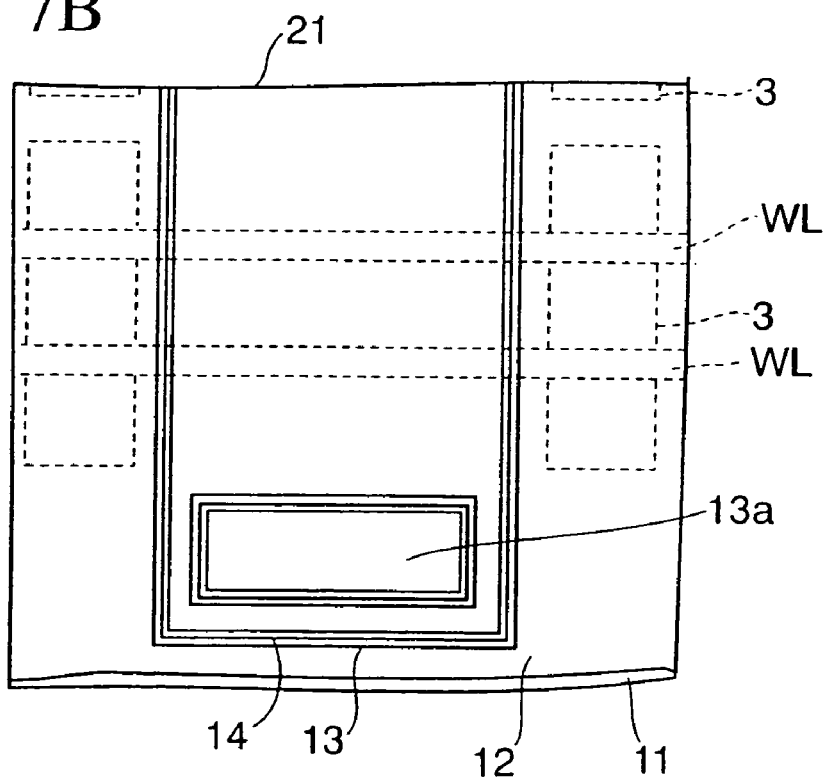
Figure 8A:
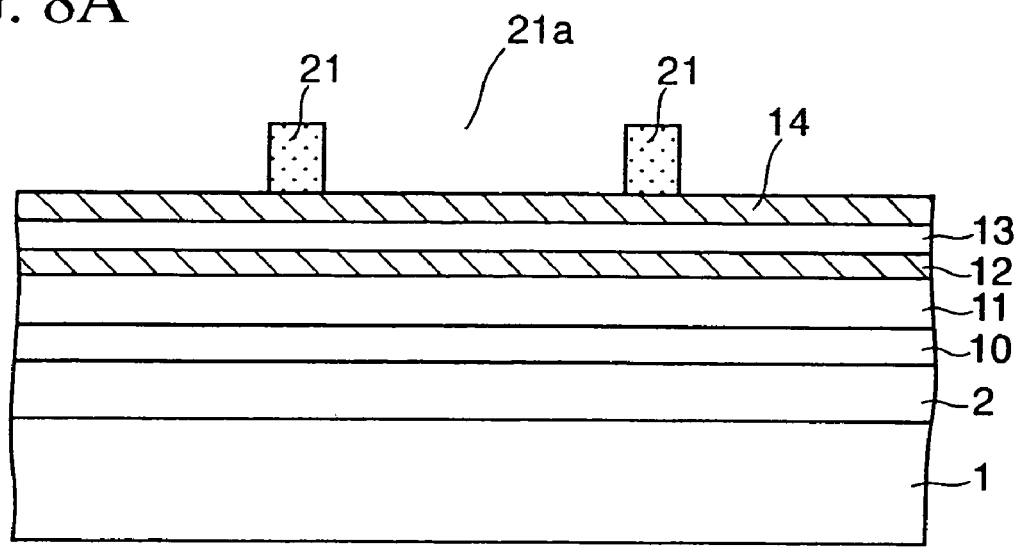
FIGS. 8A to 8G are sectional views showing steps of forming the capacitor of the memory cell of the semiconductor device according to the second embodiment of the present invention.
Figure 8B:
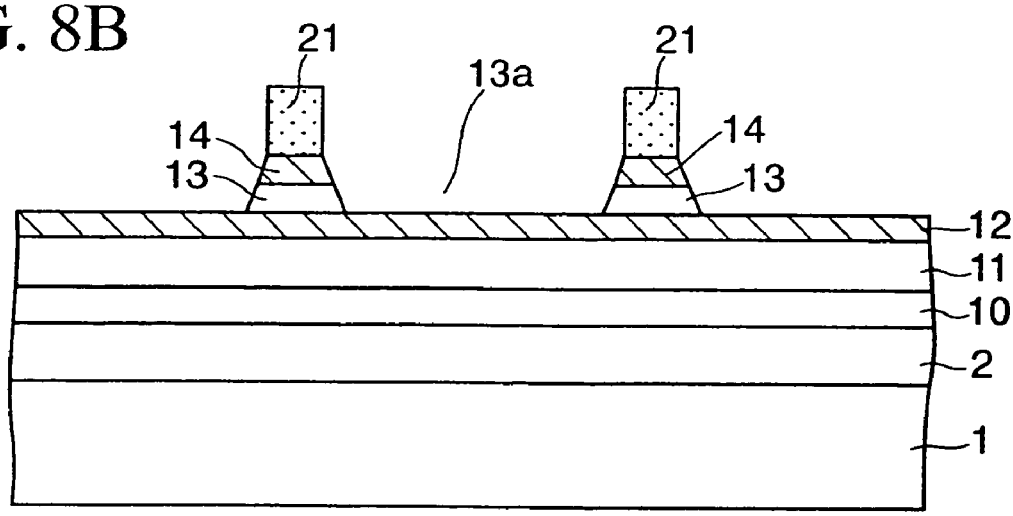

Then, as shown in FIG. 7B and FIG. 8B, the second conductive film 14 and the ferroelectric film 13 are etched by using the first resist pattern 21 as a mask. Accordingly, the second conductive film 14 and the ferroelectric film 13 have the almost same planar shape as the plate line and have an opening portion 13a that exposes the first conductive film 12 from the plate line contact region. A width of the plate line is about 2.9 μm, for example. In this case, the second conductive film 14 and the ferroelectric film 13 are removed from the upper surfaces of the MOS transistors $T_1$, $T_2$.

As the etching conditions in this case, for example, the inductively coupled plasma etching equipment is employed, the chlorine ($Cl_2$) gas and the argon (Ar) gas are introduced into the etching atmosphere at 20 ml/min and 30 ml/min respectively, and a degree of vacuum in the etching atmosphere is set to 0.7 Pa. In addition, the temperature of the wafer stage on which the silicon substrate 1 is loaded is set to 25° C., the source power is set to 1400 W, and the bias power is set to 800 W.

If the conductive product adheres to side surfaces of the first resist pattern 21, the etched second conductive film 14, and the etched ferroelectric film 13 during the etching, the leakage current tends to flow easily between the capacitor upper electrode and the capacitor lower electrode, which are formed thereafter by patterning the first and second conductive films 12, 14. Therefore, it is preferable that the second conductive film 14 and the ferroelectric film 13 should be etched to scrape the conductive material, which adheres to their side surfaces, off constantly by setting the etching conditions that cause the side surfaces of the first resist pattern 21 to retreat in the lateral direction. In this case, the retreat of side surfaces of the first resist pattern 21 is expedited. As the control of this retreat, for example, a ratio of the chlorine gas is increased and a ratio of the argon gas is decreased.

Figure 7C:
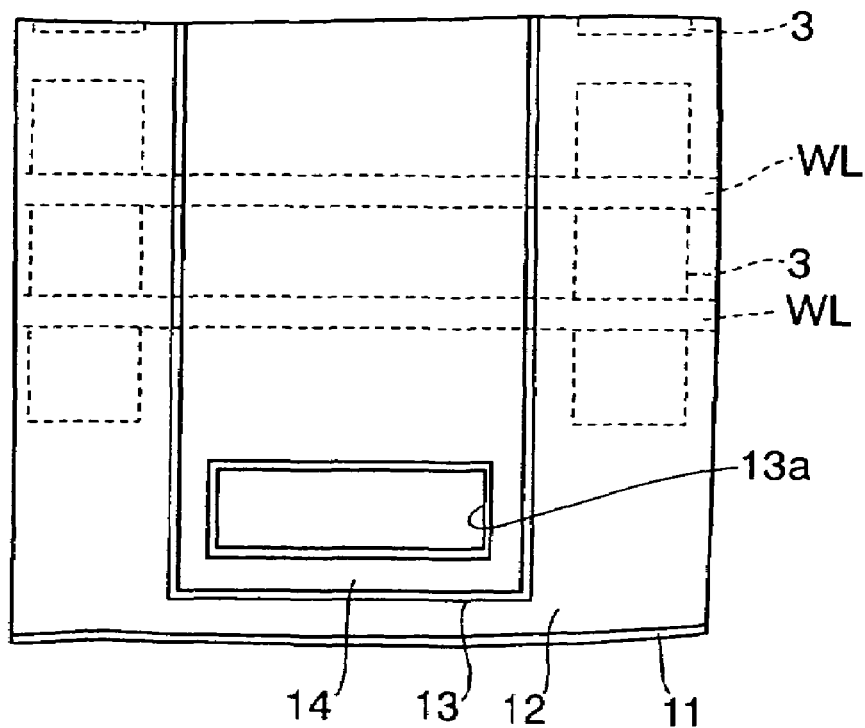
Figure 8C:
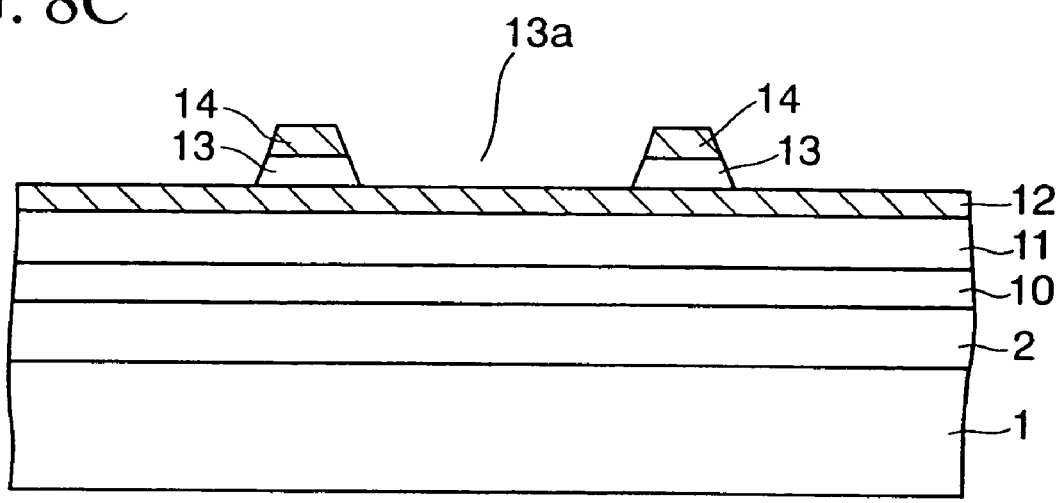

Then, as shown in FIG. 7C and FIG. 8C, the first resist pattern 21 is removed.

Figure 7D:
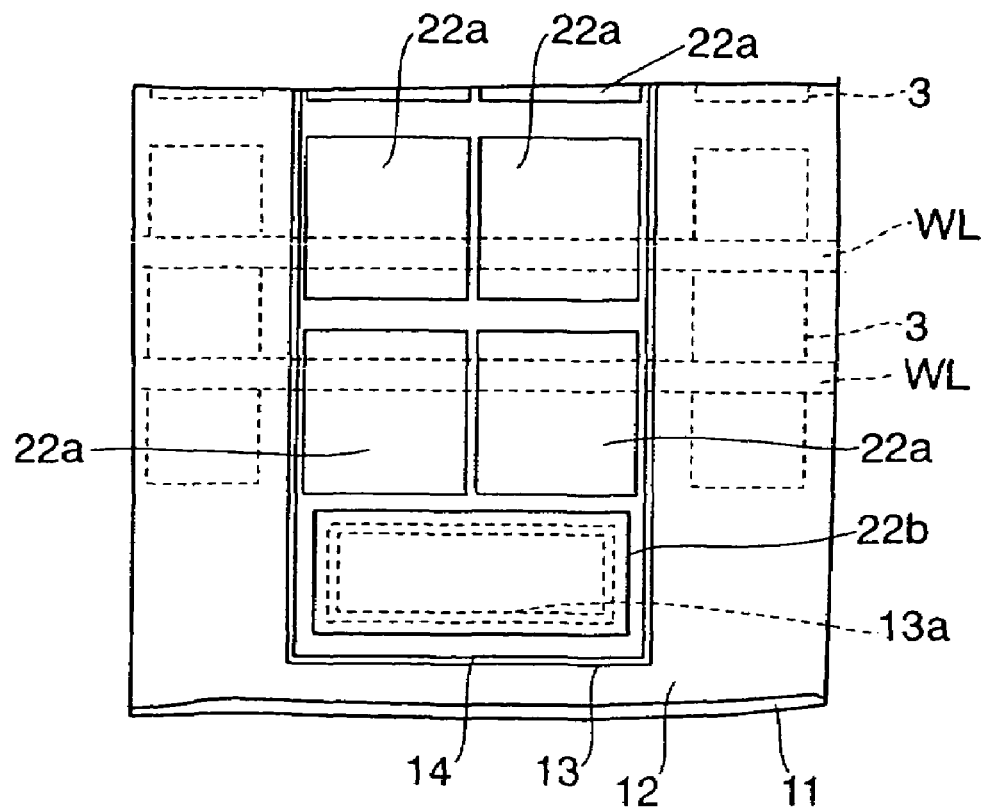
Figure 8D:
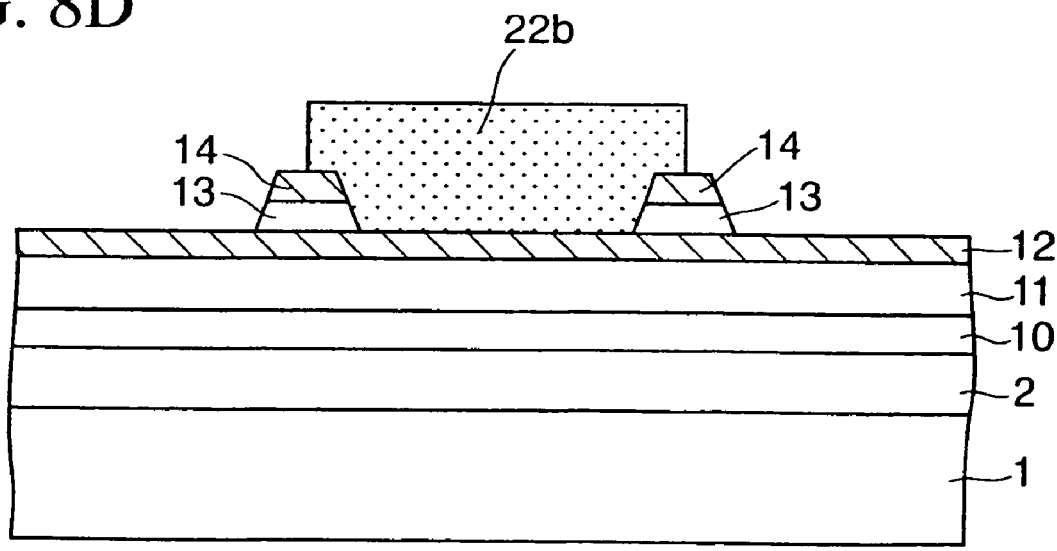

Then, a resist is coated on the first and second conductive films 12, 14 and the ferroelectric film 13. Then, the resist is exposed/developed. Thus, as shown in FIG. 7D and FIG. 8D, second resist patterns 22a each having a shape of the capacitor upper electrode, which has a width of 1.0 μm and a length of 1.7 μm, are formed on the second conductive film 14 in the plate line forming region, and also a third resist pattern 22b is formed in the plate line contact region and its periphery. This overlapping area is set to take account of displacement in the plate line contact region in the alignment. The second resist patterns 22a are formed in plural in two columns along the length direction of the plate line forming region. Also, an interval between the second resist patterns 22a is set to 0.3 μm, for example.

Figure 7E:
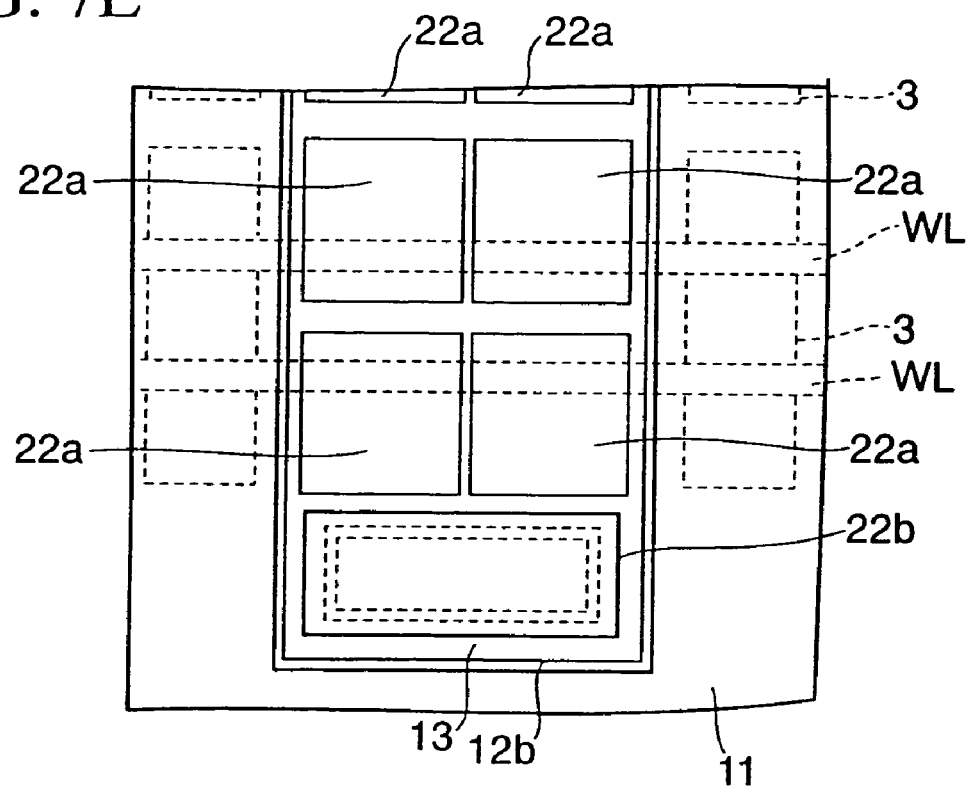
Figure 7F:
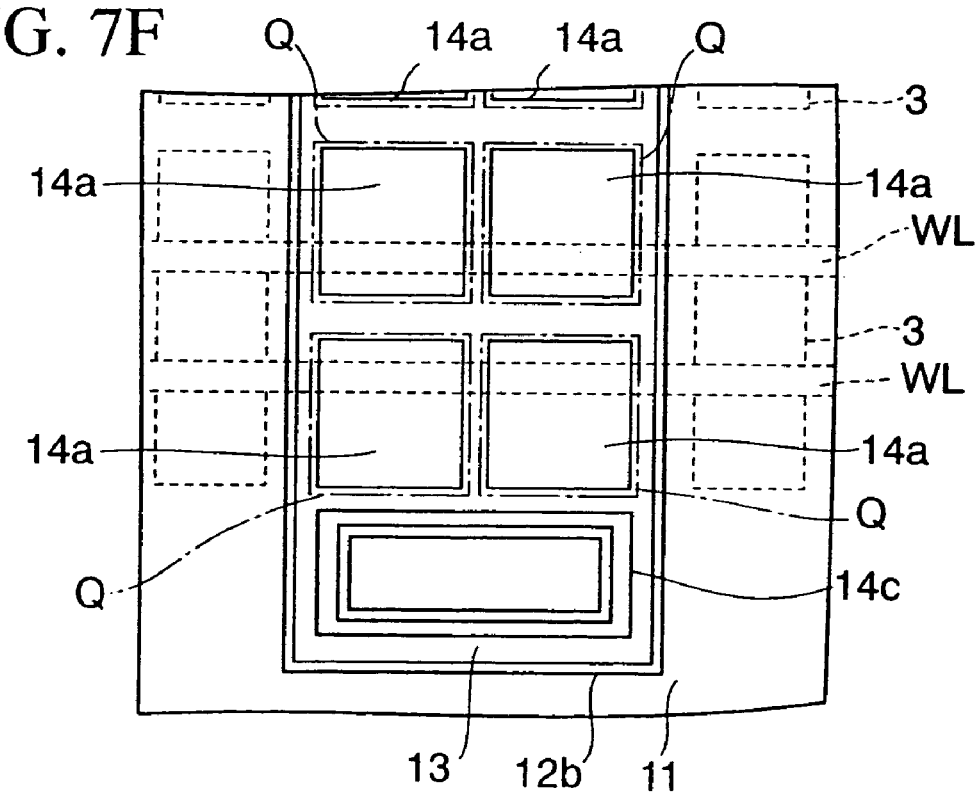
Figure 8E:
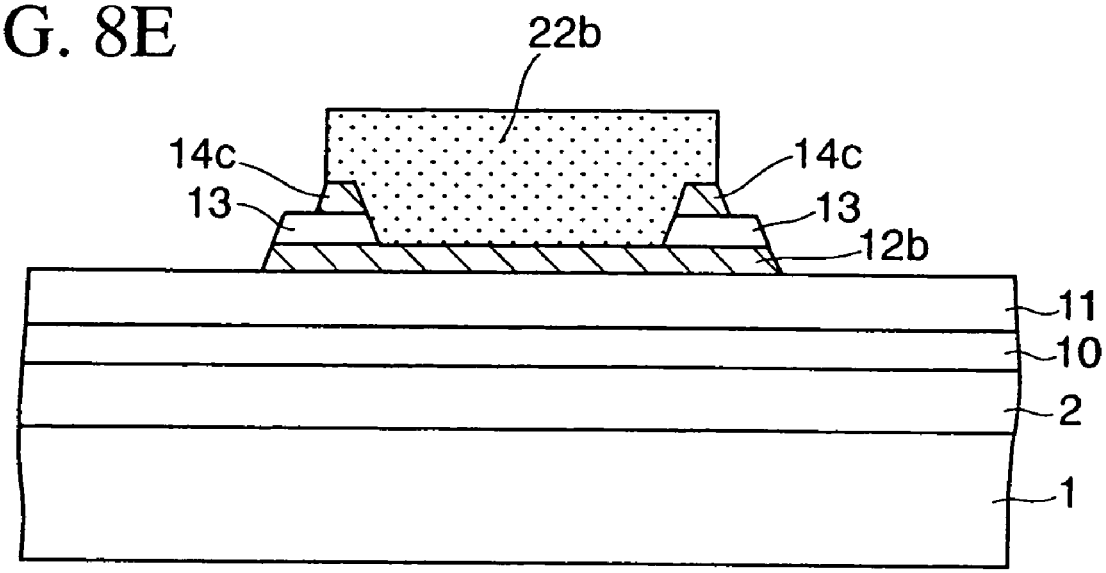
Figure 8F:
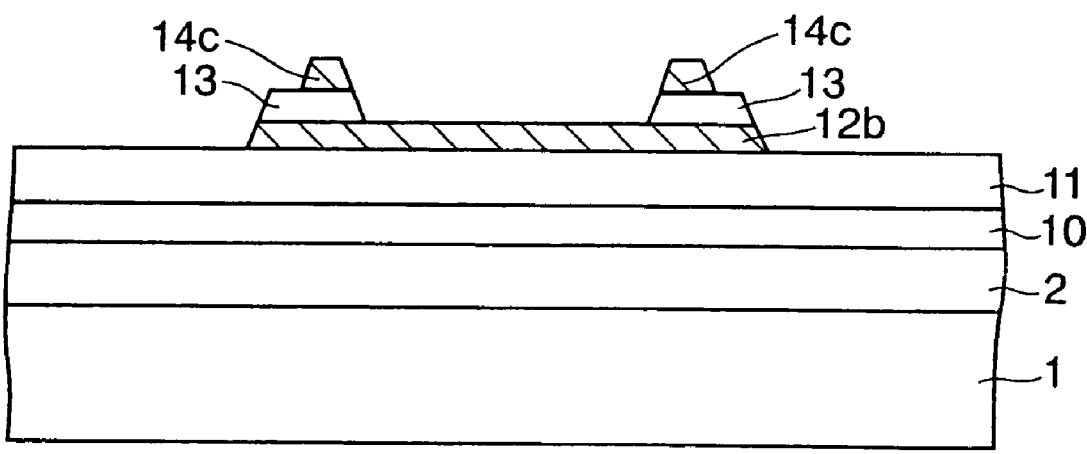

Then, as shown in FIG. 7E and FIG. 8E, the second conductive film 14 in the region that is not covered with the second resist patterns 22a is etched and simultaneously the first conductive film 12 in the region that is not covered with the third resist pattern 22b and the ferroelectric film 13 is etched. Then, as shown in FIG. 7F and FIG. 8F, the second and third resist patterns 22a, 22b are removed.

Accordingly, the first conductive film 12 is patterned into the plate line 12b as the capacitor lower electrode. Also, the second conductive film 14 is patterned into plural upper electrodes 14a, which are aligned in two columns over each plate line 12b, and is left as a frame-like isolated conductive pattern 14c to surround the periphery of the plate line contact region. In this case, like the first embodiment, the first conductive film 12 is removed from upper areas of the MOS transistors $T_1$, $T_2$.

When a part of the first conductive film 12 and a part of the second conductive film 14 are etched simultaneously in this etching, the upper electrodes 14a and the lower electrode (plate line) 12a of the final capacitors Q are formed at the same time.

In this case, the etching conditions of the first and second conductive films 12, 14, are set such that the ferroelectric film 13 on the plate line 12b is left in regions between the upper electrodes 14a and on the periphery of the plate line contact region. Also, the etching conditions must be set in response to respective film thicknesses of the first conductive film 12 and the second conductive film 14 such that the upper electrodes 14a and the capacitor lower electrode 12a is formed at the same time. In addition, the leakage current between the upper electrodes 14a and the lower electrode 12b is prevented by setting the etching conditions that cause the conductive substance not to adhere to side walls of the upper electrodes 14a, the ferroelectric film 13, and the lower electrode 12b.

As such etching conditions, for example, the inductively coupled plasma etching equipment is employed, the chlorine ($Cl_2$) gas and the argon (Ar) gas are introduced into the etching atmosphere at 20 ml/min and 30 ml/min respectively, and a degree of vacuum in the etching atmosphere is set to 0.7 Pa. In addition, the temperature of the wafer stage on which the silicon substrate 1 is loaded is set to 25° C., the source power is set to 1400 W, and the bias power is set to 800 W.

With the above, the capacitors Q each having the lower electrode 12b, the ferroelectric film 13, and the upper electrode 14a are formed in the memory cell region. That is, the capacitors Q are formed in the plate line forming region as many as the upper electrodes 14a.

In this case, the ferroelectric film 13 and the lower electrodes 12b are also present under the isolated conductive pattern 14c that is present near the plate line contact region. However, since the isolated conductive pattern 14c is put in the electrically-isolated state, such pattern is never operated as the upper electrode of the capacitor.

Then, like the case shown in FIG. 4H and FIG. 5E according to the first embodiment, the capacitor protection insulating film 17 of about 200 nm thickness is formed on the capacitors Q and the first interlayer insulating film 11. In addition, the second interlayer insulating film 18 of about 1 μm thickness is formed on the capacitor protection insulating film 17. Then, the upper surface of the second interlayer insulating film 18 is planarized by the CMP method.

Figure 7G:
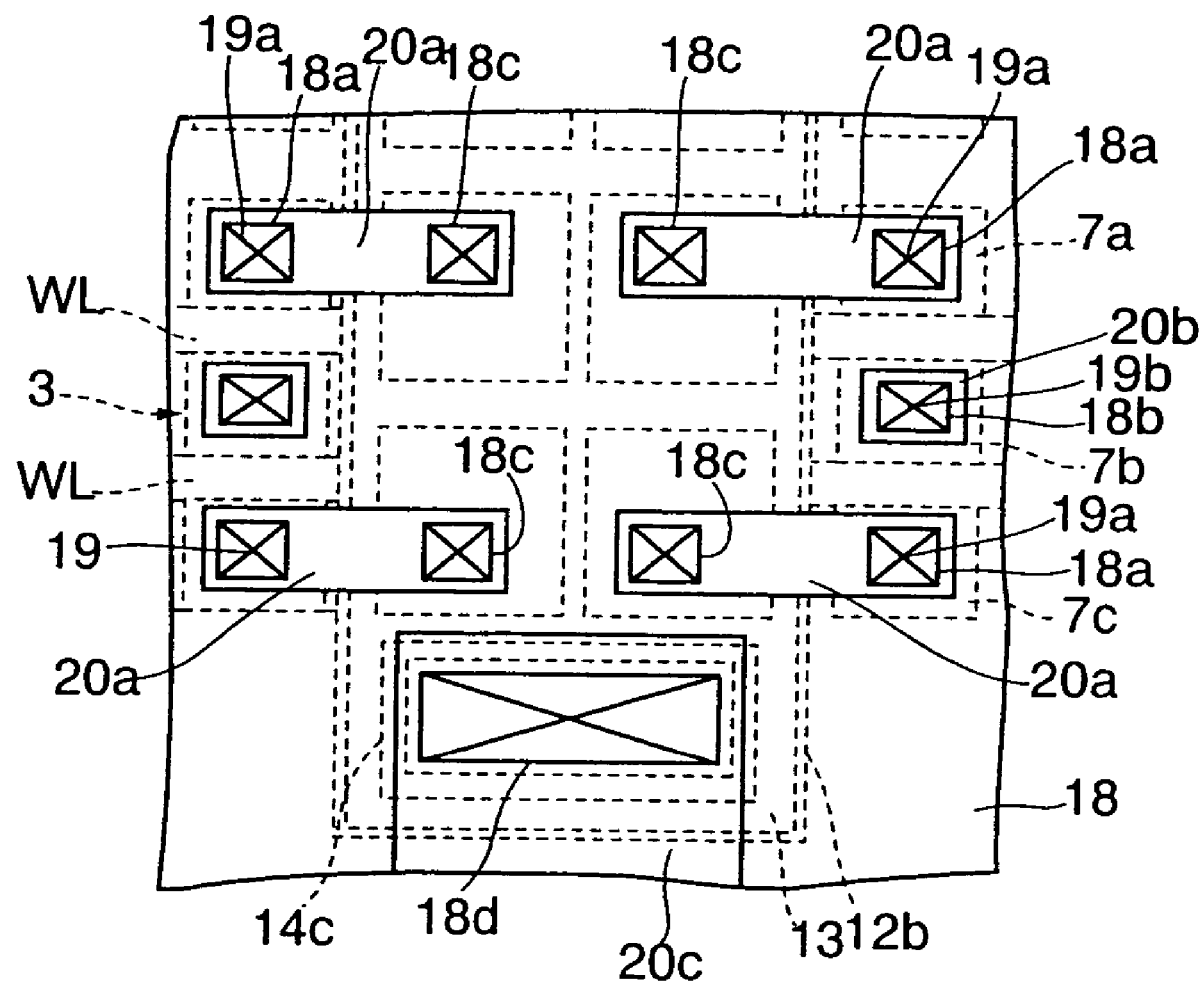
Figure 8G:
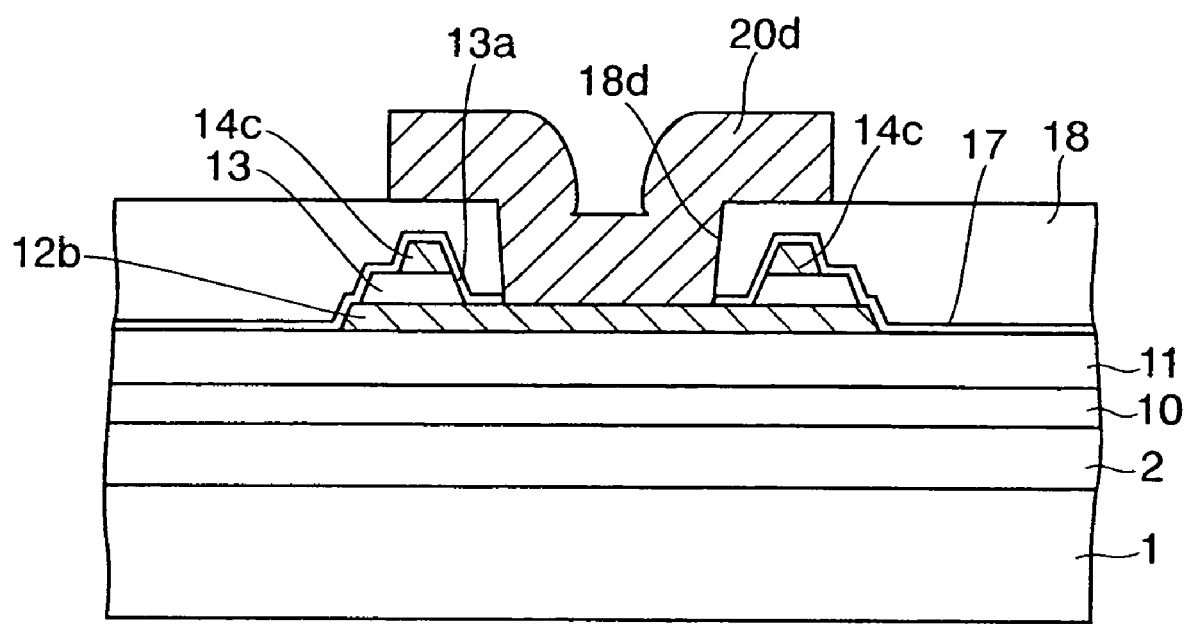

Next, steps required until structures shown in FIG. 7G and FIG. 8G are formed will be explained hereunder.

First, the second interlayer insulating film 18, the capacitor protection insulating film 17, the first interlayer insulating film 11, and the cover film 10 are patterned by the photolithography method. Thus, the capacitor contact holes 18a are formed on the first and third n-type impurity diffusion regions 7a, 7c respectively and also the bit-line contact hole 18b is formed on the second n-type impurity diffusion region 7b at the same time.

Then, according to the similar steps to the first embodiment, the first conductive plugs 19a and the second conductive plug 19b, which are made of the Ti film, the TiN film, and the W film respectively, are formed on the second interlayer insulating film 18 and in the capacitor contact holes 18a and the bit-line contact hole 18b.

Then, according to the similar steps to the first embodiment, the second interlayer insulating film 18 and the capacitor protection insulating film 17 are patterned. Thus, the capacitor contact holes 18c are formed on the upper electrodes 14a and also the plate line contact hole 18d is formed on the opening portion 13a in the ferroelectric film 13 on the plate line 12b.

Then, the wiring metal film is formed on the second interlayer insulating film 18 and the first and second conductive plugs 19a, 19b and in the contact holes 18c, 18d. Then, the wiring metal film is patterned by the photolithography method.

The first wirings 20a for connecting electrically the capacitor contact holes 18c and the first conductive plugs 19a formed on the sides thereof are formed by patterning this wiring metal film. At the same time, the conductive pads 20b are formed on the second conductive plugs 19b, and also the second wiring 20c extended from the plate line contact hole 18d is formed.

Accordingly, the upper electrodes 14a of plural capacitors Q formed on the plate line 12b in two columns are connected electrically to the first or third n-type impurity diffusion regions 7a, 7c via the first wirings 20a.

Also, the second wiring 20c is connected to a plate line control circuit in the peripheral circuit region connected to the plate line 12b.

In this case, the second n-type impurity diffusion region 7b is connected electrically to the bit line (not shown) formed over this region via the conductive pad 20b and the second conductive plug 19b.

After the wirings 20a, 20d and the conductive pads 20b are formed, a third interlayer insulating film is formed thereon, then conductive plugs are formed, and then the bit lines, etc. are formed on the third interlayer insulating film. But explanation of their details is omitted herein.

In the above embodiment, a plurality of upper electrodes 14a are formed on the ferroelectric film 13, which covers the plate line 12b serving as the lower electrode of the capacitors Q, in two columns in the extending direction of the plate line 12b. Therefore, like the first embodiment, the memory cell region is integrated more highly than the prior art.

Also, in the steps of forming the capacitors Q by patterning the first conductive film 12, the ferroelectric film 13, and the second conductive film 14, the first conductive film 12 and the ferroelectric film 13 are patterned simultaneously into the almost same planar shape as the plate line, and then the lower electrodes 12b and the upper electrodes 14a formed thereover in two columns are simultaneously formed by patterning the second conductive film 14 and the first conductive film 12 at the same time. Therefore, the capacitors Q are formed by two patterning steps and thus the capacitor forming step is shortened. In addition, the platinum constituting the plate line 12a is not exposed from the regions between the upper electrodes 14a and thus the influence of the reduction by the catalytic action of platinum on the capacitors Q is suppressed.

Further, since the periphery of the plate line contact portion of the plate line 12b is brought into the state that such area is covered with the ferroelectric film 13, the catalytic action by the plate line 12b is suppressed much more in contrast to the first embodiment.

Third Embodiment

In the present embodiment, capacitor manufacturing steps of forming an upper electrode of a capacitor in the semiconductor device with higher precision will be explained hereunder.

FIGS. 9A to 9F are sectional views showing steps of forming a capacitor of a memory cell of a semiconductor device according to a third embodiment of the present invention. FIGS. 10A to 10E are plan views showing steps of forming the capacitor of the memory cell of the semiconductor device according to the third embodiment of the present invention. In this case, FIGS. 9A to 9F are sectional views taken along a V-V line in FIG. 10A.

First, as shown in FIG. 4A, FIG. 5A, and FIG. 6A according to the first embodiment, the element isolation insulating film 2, the MOS transistors $T_1$, $T_2$, the cover film 10, the first interlayer insulating film 11, etc. are formed on the silicon substrate 1. Then, as shown in FIG. 4B and FIG. 6B, the first conductive film 12, the ferroelectric film 13, and the second conductive film 14 are formed in sequence on the first interlayer insulating film 11. Then, the second conductive film 14 and the ferroelectric film 13 are etched by using the first resist pattern 15. Thus, as shown in FIG. 4D and FIG. 6D, the ferroelectric film 13 and the second conductive film 14 are patterned into the shape of the plate line forming region except the plate line contact region. This etching is executed in compliance with the conditions shown in the first embodiment.

Figure 9A:
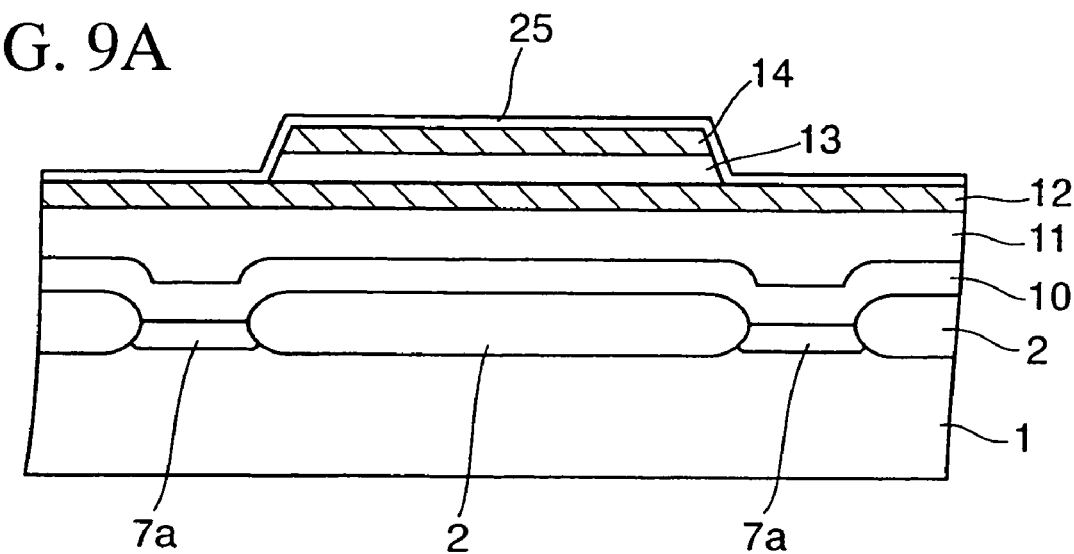
FIGS. 9A to 9F are sectional views showing steps of forming a capacitor of a memory cell of a semiconductor device according to a third embodiment of the present invention.
Figure 10A:
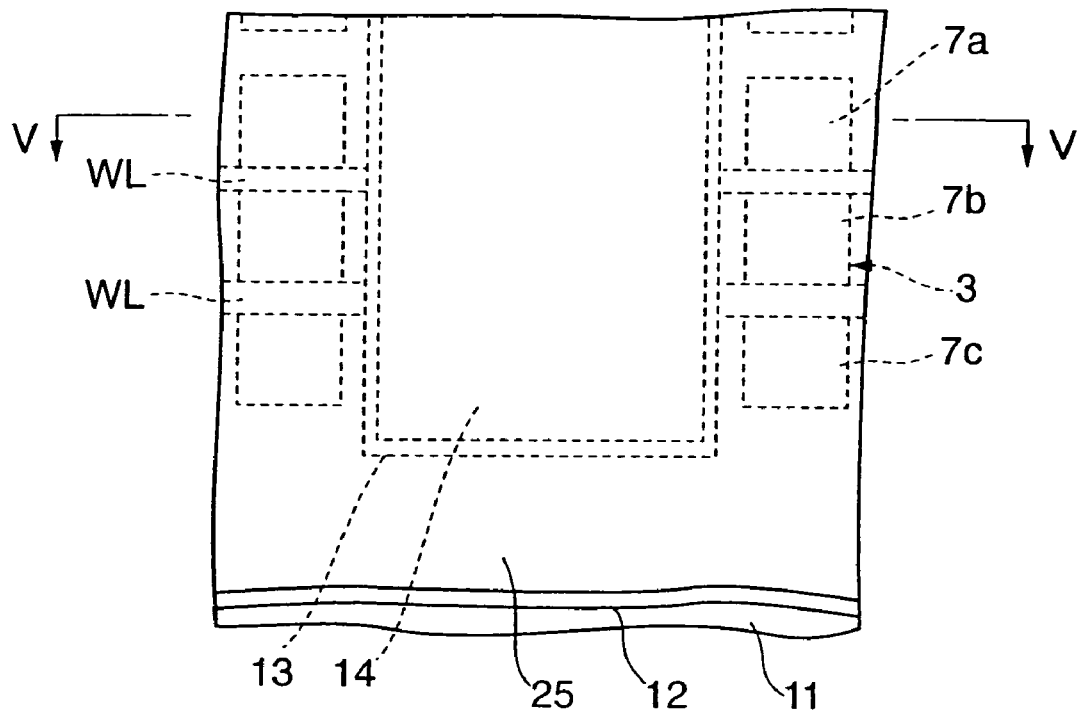
FIGS. 10A to 10E are plan views showing steps of forming the capacitor of the memory cell of the semiconductor device according to the third embodiment of the present invention.

Then, as shown in FIG. 9A and FIG. 10A, an alumina film of 50 nm thickness is formed as a first capacitor protection insulating film 25 on the second conductive film 14, the ferroelectric film 13, and the first conductive film 12, which are patterned, by the sputter. The film made of material that has the etching selectivity and the capacitor protecting characteristic is preferable as the first capacitor protection insulating film 25, and a titanium oxide film, or the like as well as the alumina film may be formed.

Figure 9B:
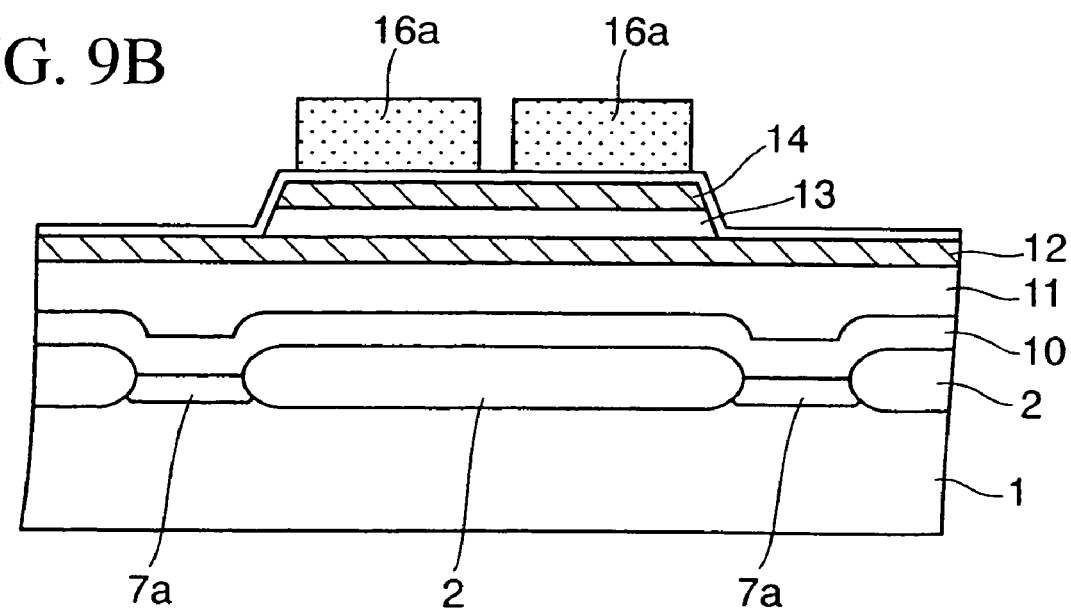
Figure 10B:
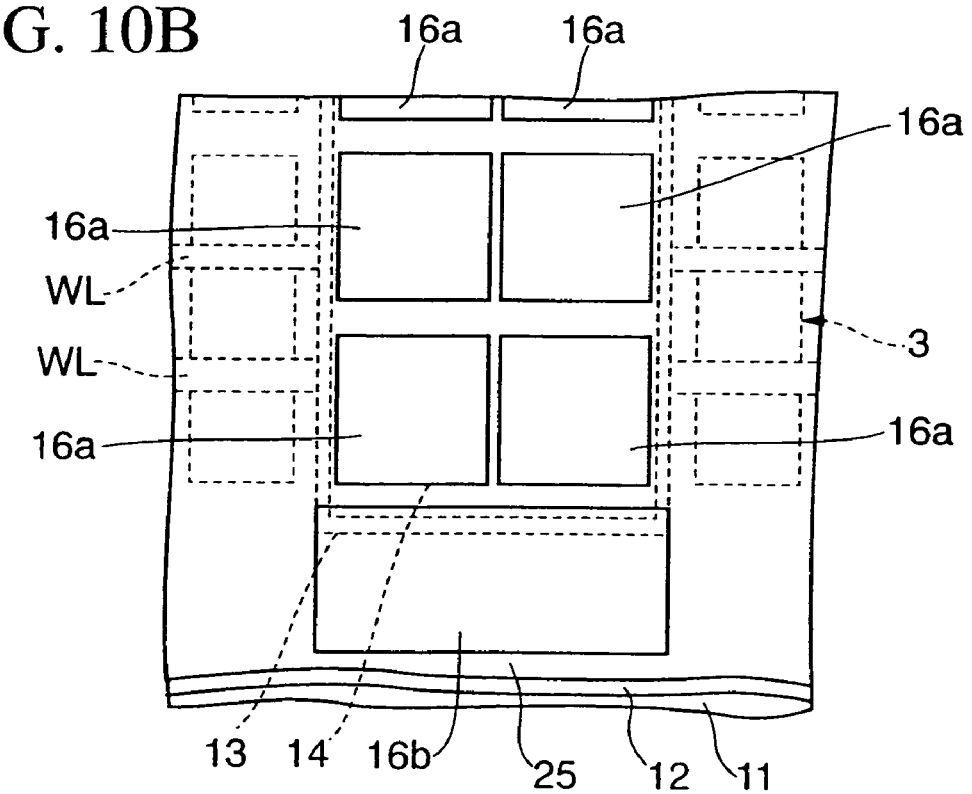

Then, a resist is coated on the first capacitor protection insulating film 25. Then, as shown in FIG. 9B and FIG. 10B, the resist is exposed and developed. Thus, the second resist patterns 16a each having the shape of the capacitor upper electrode, which has a width of 1.0 μm and a length of 1.7 μm, are formed over the second conductive film 14 that is present in the plate line forming region, and also the third resist pattern 16b having a size that overlaps slightly with the end portion of the second conductive film 14 from the plate line contact region is formed on the first capacitor protection insulating film 25. This overlapping area is set to an amount to take account of displacement in the plate line contact region in the alignment.

The second resist patterns 16a are formed in plural in two columns along the length direction of the plate line forming region. An interval between the second resist patterns 16a is set to 0.3 μm, for example.

Figure 9C:
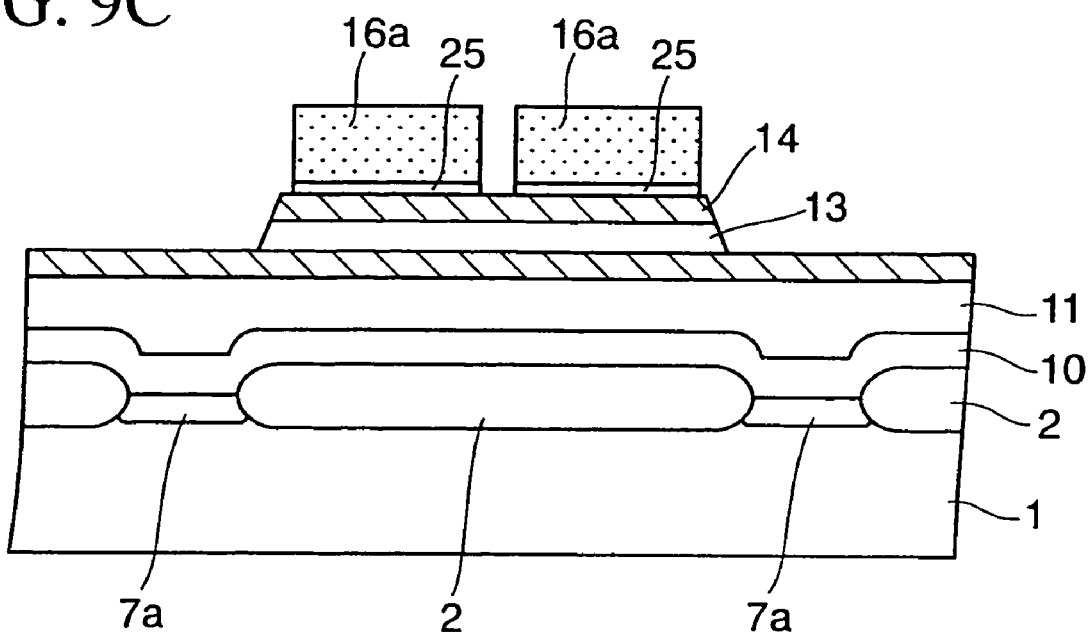
Figure 10C:
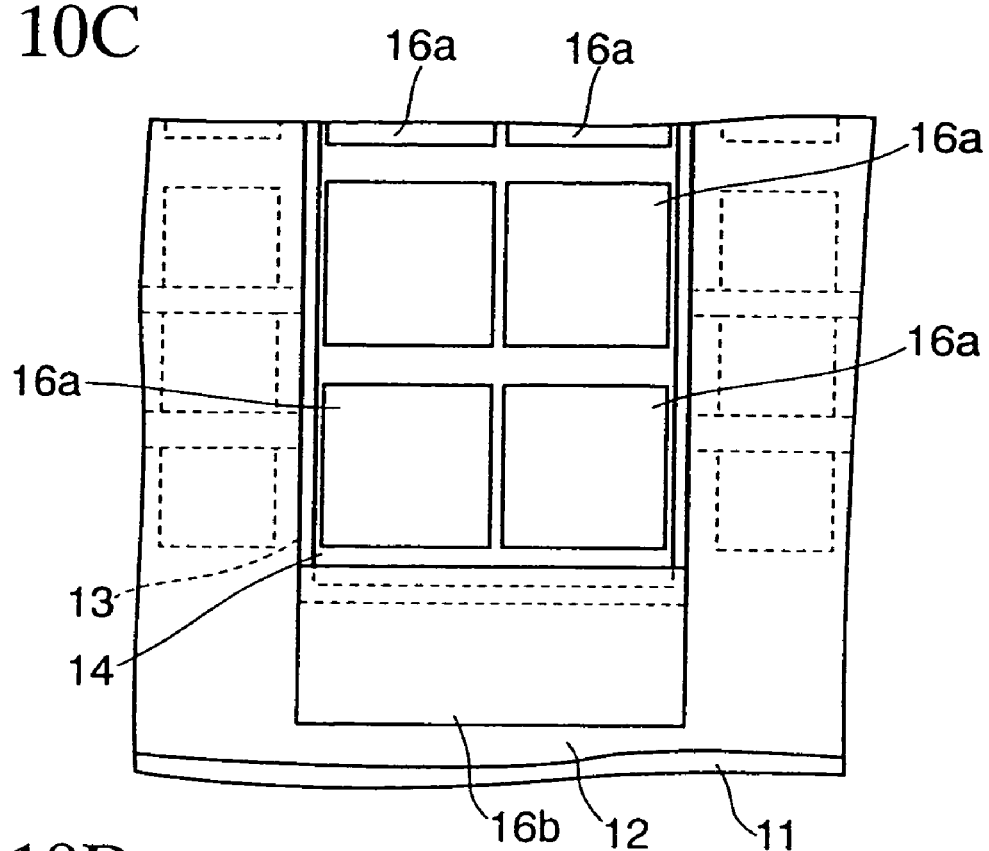

Then, as shown in FIG. 9C and FIG. 10C, the first capacitor protection insulating film 25 is etched by using the second and third resist patterns 16a, 16b as a mask. In this case, the etching of the first capacitor protection insulating film 25 is carried out under the conditions that causes less retreat of the side surfaces of the second and third resist patterns 16a, 16b.

For example, the inductively coupled plasma etching equipment is employed, the chlorine ($Cl_2$) gas and the argon (Ar) gas are introduced into the etching atmosphere at 5 ml/min and 45 ml/min respectively, and a degree of vacuum in the etching atmosphere is set to 0.7 Pa. In addition, the temperature of the wafer stage on which the silicon substrate 1 is loaded is set to 25° C., the source power is set to 1400 W, and the bias power is set to 800 W. A retreating speed of the sides of the resist patterns 16a, 16b can be adjusted by changing a ratio of the chlorine gas.

Since the resist volatilizes by the reaction with the chlorine, reduction of the resist patterns 16a, 16b is suppressed by using the conditions that a ratio of the chlorine gas is set low and a ratio of the argon gas is set high, like the above conditions. Hence, the first capacitor protection insulating film 25 is patterned into the planar shape that is almost close to initial states of the second and third resist patterns 16a, 16b.

According to such etching conditions, the first and second conductive films 12, 14 are also etched. However, the conductive product being generated by the etching adheres to side surfaces of the second and third resist patterns 16a, 16b, etched side surfaces of the first and second conductive films 12, 14, and side surfaces of the ferroelectric film 13 and then causes increase of the leakage current in the capacitor.

Therefore, after the etching of the first capacitor protection insulating film 25 is ended, the etching conditions are changed to cause the side surfaces of the second and third resist patterns 16a, 16b to retreat.

As such etching conditions, for example, the inductively coupled plasma etching equipment is employed, the chlorine ($Cl_2$) gas and the argon (Ar) gas are introduced into the etching atmosphere at 15 ml/min and 35 ml/min respectively, and a degree of vacuum in the etching atmosphere is set to 0.7 Pa. In addition, the temperature of the wafer stage on which the silicon substrate 1 is loaded is set to 25° C., the source power is set to 1400 W, and the bias power is set to 800 W.

The side surfaces of the second and third resist patterns 16a, 16b are caused to retreat appropriately by increasing the ratio of the chlorine gas in this manner, and thus the reaction product being generated by etching the first and second conductive films 12, 14 is prevented from adhering to the side walls.

In this case, in etching the first and second conductive films 12, 14, not only the second and third resist patterns 16a, 16b but also the first capacitor protection insulating film 25 is used as a mask.

Figure 9D:
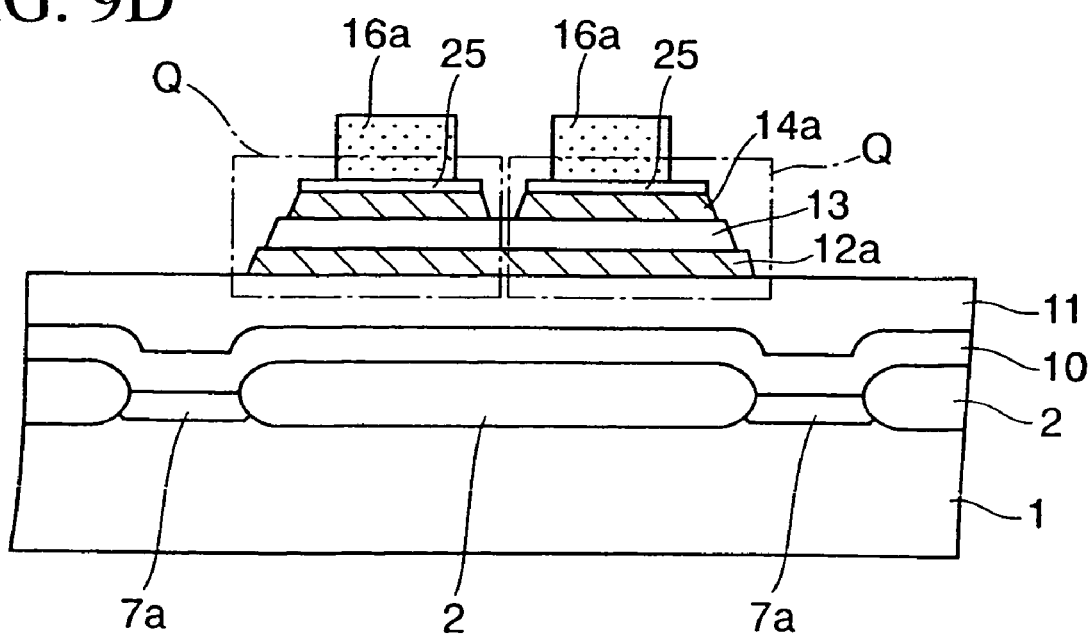
Figure 10D:
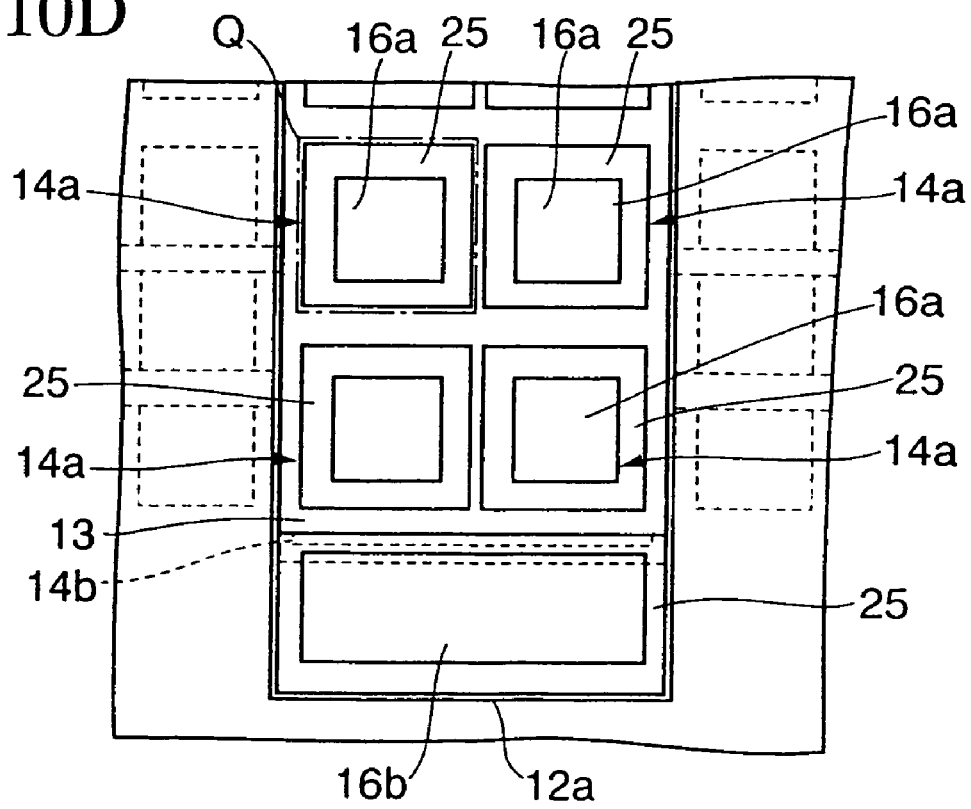

According to this etching, as shown in FIG. 9D and FIG. 10D, the second and third resist patterns 16a, 16b are reduced rather than their initial state and also the first conductive film 12 and the second conductive film 14 are etched partially at the same time. Thus, the upper electrodes 14a and the lower electrode 12a of the final capacitors Q are formed simultaneously.

Then, the second and third resist patterns 16a, 16b are removed.

Thus, the first conductive film 12 is patterned into the plate line as the capacitor lower electrode 12a. Also, the second conductive film 14 is patterned to form a plurality of upper electrodes 14a, which are aligned in parallel in two columns, and to leave the isolated conductive pattern 14b at the boundary portion between the plate line contact region and the ferroelectric film 13.

As a result, the capacitors Q each having the lower electrode 12a, the ferroelectric film 13, and the upper electrode 14a are formed in the memory cell region. That is, the capacitors Q are formed as many as the upper electrodes 14a in the plate line forming region.

In this case, the ferroelectric film 13 and the lower electrode 12a are present under the isolated conductive pattern 14b. However, since the isolated conductive pattern 14b is put into the electrically-isolated state, it does not operate as the upper electrode of the capacitor.

Figure 9E:
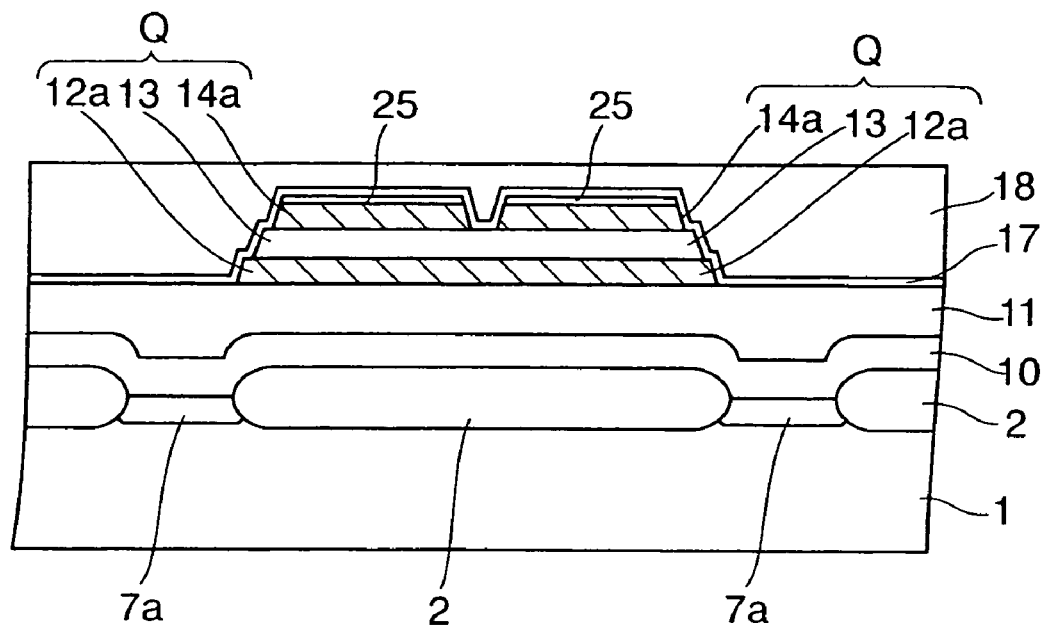

Then, as shown in FIG. 9E, alumina of about 200 nm thickness, for example, is formed as the second capacitor protection insulating film 17 on the capacitors Q, the first capacitor protection insulating film 25, and the first interlayer insulating film 11. In this case, as the capacitor protection insulating film 17, a PZT film, a silicon nitride film, a silicon oxide nitride film, or the like may be applied in addition to the alumina.

In addition, a silicon oxide film of about 1 μm thickness is formed as a second interlayer insulating film 18 on the second capacitor protection insulating film 17. Then, the upper surface of the second interlayer insulating film 18 is planarized by the CMP method.

Figure 9F:
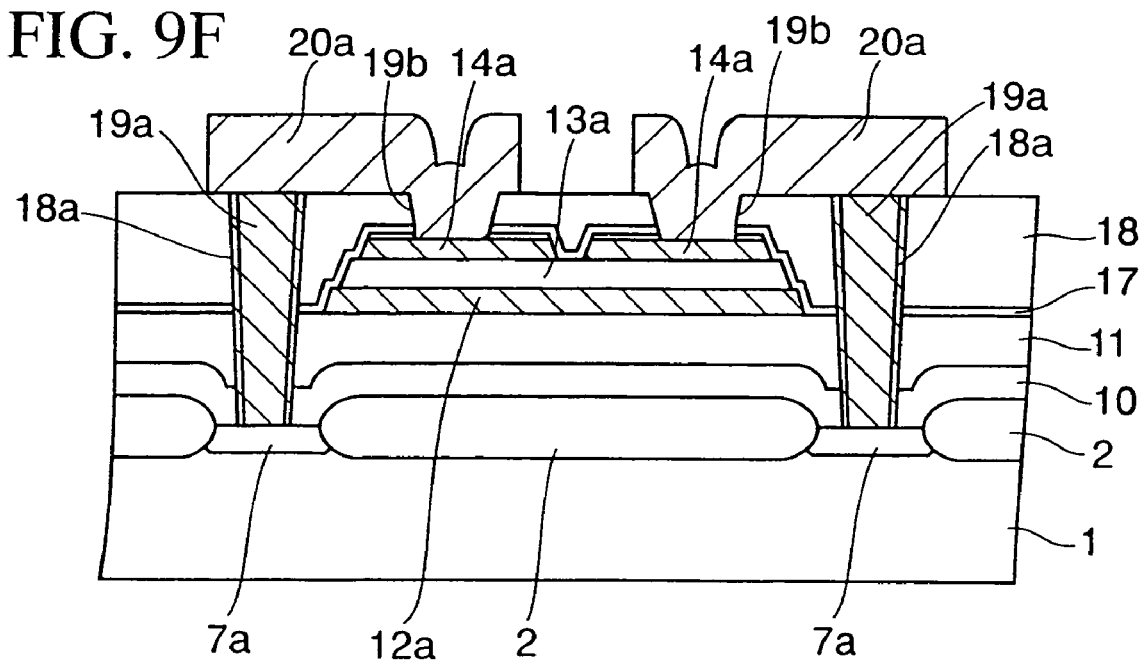
Figure 10E:
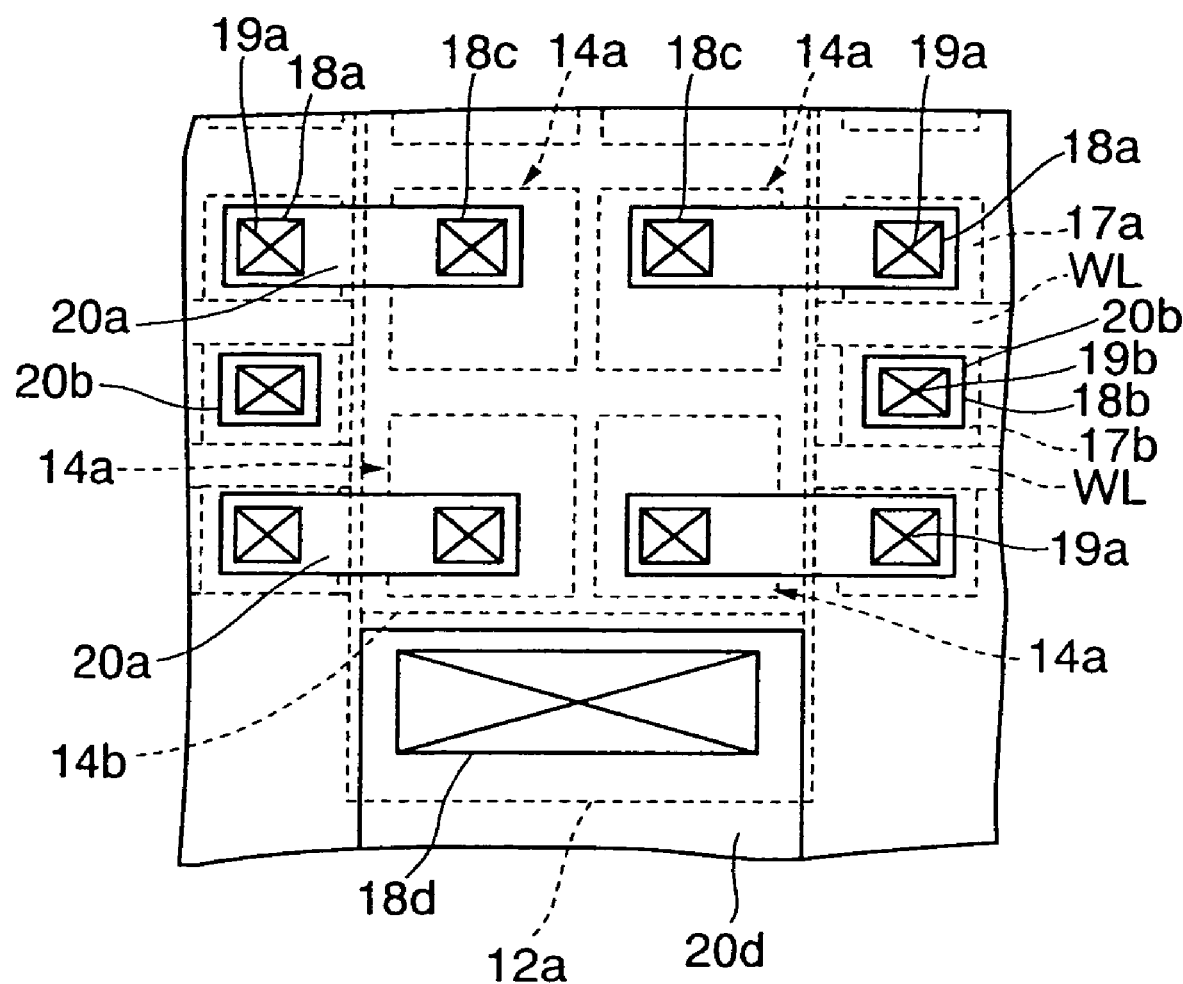

Next, steps required until structures shown in FIG. 9F and FIG. 10E are formed will be explained hereunder.

First, the second interlayer insulating film 18, the second capacitor protection insulating film 17, the first interlayer insulating film 11, and the cover film 10 are patterned by the photolithography method. Thus, the capacitor contact holes 18a are formed on the first and third n-type impurity diffusion regions 7a, 7c respectively and simultaneously the bit-line contact hole 18b is formed on the second n-type impurity diffusion region 7b.

Then, according to the same steps as the first embodiment, the first conductive plugs 19a for capacitor contact are formed in the capacitor contact holes 18a and also the second conductive plug 19b for bit-line contact is formed in the bit-line contact hole 18b.

Then, the capacitor contact holes 18c are formed on the upper electrodes 14a by patterning the second interlayer insulating film 18 and the first and second capacitor protection insulating films 25, 17. At the same time, the plate line contact hole 18d is formed on the plate line contact region of the plate line 12a by patterning the second interlayer insulating film 18 and the second capacitor protection insulating film 17.

Then, the wiring metal film is formed on the second interlayer insulating film 18 and the first and second conductive plugs 19a, 19b and in the contact holes 18c, 18d. Then, the wiring metal film is patterned by the photolithography method.

The first wirings 20a for connecting electrically the capacitor contact holes 18c and the first conductive plugs 19a formed on the sides thereof are formed by patterning this wiring metal film. At the same time, the conductive pads 20b are formed on the second conductive plugs 19b. In addition, the second wiring 20c is formed in the contact hole 18d on the second interlayer insulating film 18 in the plate line contact region.

Accordingly, the upper electrodes 14a, which are formed on the plate line 12a in two columns, and the first or third n-type impurity diffusion regions 7a, 7c are connected electrically via the first wirings 20a and the first conductive plugs 19a.

In this case, the second n-type impurity diffusion region 7b is connected electrically to the bit line (not shown) formed over this region via the conductive pad 20b and the second conductive plug 19b.

After the wirings 20a, 20d and the conductive pads 20b are formed, the third interlayer insulating film is formed thereon, then conductive plugs are formed, and then the bit lines, etc. are formed on the third interlayer insulating film. But explanation of their details is omitted herein.

In the above embodiment, a plurality of upper electrodes 14a are formed on the ferroelectric film 13, which covers the plate line 12b serving as the capacitor lower electrode, in two columns in the extending direction of the plate line 12a. Therefore, like the first embodiment, the memory cell region is integrated more highly than the prior art.

Also, in the steps of forming the capacitors Q by patterning the first conductive film 12, the ferroelectric film 13, and the second conductive film 14, the lower electrode 12a and the upper electrodes 14a formed thereon in two columns are formed at the same time by patterning simultaneously the first conductive film 12 and the ferroelectric film 13 into the planar shape along the plate line and then patterning simultaneously the second conductive film 14 and the first conductive film 12.

Therefore, the capacitor forming step is carried out by two sheets of resist masks, and the throughput is improved. Also, the platinum constituting the lower electrode 12b is never exposed from the regions between the upper electrodes 14a. Thus, influence of the reducing action of the platinum catalyst on the capacitors Q is prevented.

In addition, in the situation that the second conductive film 14 is covered with the first capacitor protection insulating film 25 that is patterned into the shape of the capacitor upper electrode, the second conductive film 14 is etched under the conditions that cause the side of the resist pattern 16a to retreat. Accordingly, since the side surfaces of the resist pattern 16a are caused to retreat, the reaction product that adheres to side surfaces of the upper electrodes 14a, the ferroelectric film 13, and the lower electrode 12a is removed by the etching. In addition, since the first capacitor protection insulating film 25 is functioned as a mask, the patterning precision of the upper electrodes 14a can be enhanced.

Also, since the upper surface of the plate line 12b is still covered with the first capacitor protection insulating film 25 near the plate line contact portion, the catalytic action of the platinum can be suppressed further rather than the first embodiment.

COMPARATIVE EXAMPLES

Meanwhile, as the steps of forming a plurality of capacitor upper electrodes in two columns on one plate line, three examples may be considered as follows. But the patterning steps are increased rather than above first to third embodiments, otherwise it is difficult to prevent the catalytic action of the plate line.

Comparative Example 1

FIGS. 11A to 11D are plan views showing steps of forming a capacitor of a memory cell according to a comparative example 1. FIGS. 12A to 12D are sectional views showing steps of forming the capacitor of the memory cell according to the comparative example 1, and taken along a VI-VI line in FIG. 11A.

First, as shown in FIG. 11A and FIG. 12A, a first conductive film 52, a ferroelectric film 53, and a second conductive film 54 are formed sequentially on an interlayer insulating film 51, and then a plurality of upper electrodes 54a are formed in two columns along the plate line forming region by patterning the second conductive film 54 while using a first resist pattern (not shown). Then, a second resist pattern 55 is formed in the cell plate line forming region except the cell plate contact region by coating a resist on the upper electrodes 54a and the ferroelectric film 53 and then exposing/developing it. In this case, side surfaces of the upper electrodes 54a on both sides of the plate line forming region are positioned to coincide substantially with both side surfaces of the second resist pattern 55.

Then, as shown in FIG. 11B and FIG. 12B, the ferroelectric film 53 is etched by using the second resist pattern 55 as a mask, and then the second resist pattern 55 is removed.

Then, as shown in FIG. 11C and FIG. 12C, a third resist pattern 56 for covering the cell plate line forming region is formed by coating a resist on the upper electrodes 54a, the ferroelectric film 53, and the first conductive film 52 and then exposing/developing it.

Then, as shown in FIG. 11D and FIG. 12D, a lower electrode 52a is formed by etching the first conductive film 52 while using the third resist pattern 56 as a mask. Then, the third resist pattern 56 is removed.

According to the above capacitor forming steps, the resist pattern must be formed three times to pattern separately the first conductive film 52, the ferroelectric film 53, and the second conductive film 54 respectively.

In contrast, in the above embodiments, the ferroelectric film 13, and the second conductive film 14 are patterned simultaneously, and then the second conductive film 14 and the first conductive film 12 are patterned simultaneously. Thus, the number of times required for formation of the resist pattern can be reduced to two times.

Also, in the comparative example 1, if the displacement occurs in respective forming positions of the second resist pattern 55 used to pattern the ferroelectric film 53 and the third resist pattern 56 used to pattern the first conductive film 52, the left or right upper electrode 54a is also etched in etching the ferroelectric film 53 or in etching the first conductive film 52, so that it is possible that variation in the areas between the left and right upper electrodes 54a is caused. The variation in areas of the upper electrodes 54a causes nonuniform capacitances of plural capacitors in the memory cell region. In addition, it is possible that, after the upper electrodes 54a are formed, such upper electrodes 54a are exposed two times to the etching atmosphere.

The variation in areas of the upper electrodes 54a causes variation in charges in the capacitor and thus exerts an influence on the operational margin of the device. In particular, in the 1T1C-type FeRAM, the variation in individual capacitor charges poses a serious problem since "1" and "0" are read by comparing the capacitor of the memory cell with the reference capacitor.

In contrast, in the above embodiments, the formation of the upper electrodes 14a is executed simultaneously with the formation of the lower electrode 12a, and the upper electrodes 14a are never exposed to the etching atmosphere later in the capacitor forming steps. In addition, if the margin is assured previously in compliance with Inequality (1) shown in the first embodiment, the areas of a plurality of capacitor upper electrodes 14a can be made substantially uniform.

Comparative Example 2

FIGS. 13A to 13D are plan views showing steps of forming a capacitor of a memory cell according to a comparative example 2. FIGS. 14A to 14D are sectional views showing steps of forming the capacitor of the memory cell according to the comparative example 2, and taken along a VII-VII line in FIG. 13A.

As shown in FIGS. 13A to 13D and FIGS. 14A to 14D, the comparative example 2 shows steps of forming a plurality of capacitors on the plate line in two columns according to the almost same steps as the comparative example 1.

The comparative example 2 is different from the comparative example 1 in that positional displacements of the second resist pattern 55 and the third resist pattern 56 from the patterns of the upper electrodes 54a are assumed previously and then a width of the upper electrode 54a is reduced by such positional displacements.

As a result, according to the comparative example 2, the second resist pattern 55 and the third resist pattern 56 can be formed such that each both side surfaces of the second resist pattern 55 and the third resist pattern 56 can be positioned on the outer side than the side surfaces of the upper electrodes 54a. Thus, the patterns of the upper electrodes 54a can be formed uniformly.

However, the cell area efficiency becomes worse since the area of the upper electrode 54a is reduced, and also the throughput is lowered since three sheets of resist patterns must be employed.

Comparative Example 3

FIGS. 15A to 15D are plan views showing steps of forming a capacitor of a memory cell according to a comparative example 3. FIGS. 16A to 16D are sectional views showing steps of forming the capacitor of the memory cell according to the comparative example 3, and taken along a VIII-VIII line in FIG. 15A.

First, as shown in FIG. 15A and FIG. 16A, a first conductive film 62, a ferroelectric film 63, and a second conductive film 64 are formed in sequence on an interlayer insulating film 61.

Then, as shown in FIG. 15B and FIG. 16B, a plurality of capacitor upper electrodes 64a and a plurality of capacitor dielectric films 63a are formed in two columns along the plate line forming region by patterning the second conductive film 64 and the ferroelectric film 63 while using first resist patterns 65 each having the capacitor shape as a mask. Then, the first resist patterns 65 are removed.

Then, as shown in FIG. 15C and FIG. 16C, a second resist pattern 66 having the cell plate line shape is formed by coating a resist on the upper electrodes 64a, the ferroelectric film 63, and the first conductive film 62 and then exposing/developing it. In this case, the second resist pattern 66 is formed to substantially mate respective side surfaces of the upper electrodes 64a, which are present on the left and right sides in the plate line forming region, with both side surfaces of the second resist pattern 66.

Then, as shown in FIG. 15D and FIG. 16D, the first conductive film 62 is etched by using the second resist pattern 66 as a mask, and then the second resist pattern 66 is removed. Thus, the first conductive film 62 is patterned into the lower electrode 62a.

According to the above capacitor forming steps, since the first conductive film 62 and the ferroelectric film 63 are patterned once and then the second conductive film 64 is patterned once, twice resist pattern formations are required. Therefore, the steps can be shortened rather than the comparative examples 1, 2. Also, since the etching is executed once after the upper electrodes 64a are formed, such a possibility that the variation is caused in the capacitor upper electrodes 64a becomes lower than the comparative examples 1, 2.

However, since the second conductive film 64 and the ferroelectric film 63 are etched simultaneously, the exposure of the capacitor lower electrode 62a in the peripheral areas of the capacitor upper electrodes 64a is brought about.

The platinum-group metal such as platinum or the like, which has the high catalytic effect, is employed as the capacitor lower electrode. Thus, it is possible largely to cause the gas employed in the film forming step, the etching step, etc. to deteriorate the capacitors after the capacitors are formed.

In contrast, according to the above embodiments of the present invention, since the ferroelectric film 13 and the second conductive film 14 are patterned simultaneously and then the second conductive film 14 and the first conductive film 12 are patterned simultaneously, the ferroelectric film 13 is still left near the capacitor upper electrodes 14a. Therefore, the capacitor lower electrode 12a is covered with the ferroelectric film 13 and thus the catalytic action of the platinum-group metal can be largely suppressed.

In this case, it is set forth in Patent Application Publication (KOKAI) 2001-257320 that a plurality of capacitors are formed by using a sheet of resist pattern. It is inevitable that the lower electrode is exposed between the upper electrodes.

As described above, according to the present invention, the first conductive film, the dielectric film, and the second conductive film are formed sequentially on the insulating film, then the second conductive film and the dielectric film are patterned into the first pattern shape by using the first mask, and then the first conductive film and the second conductive film are patterned simultaneously by using the second mask. Thus, plural capacitor upper electrodes are formed from the second conductive film and also the plate line (lower electrode) is formed from the first conductive film. Therefore, the capacitors can be formed by using two masks and also the throughput of the capacitor forming steps can be improved.

Also, the first conductive film and the second conductive film are patterned simultaneously. Therefore, the dielectric film can be left in the state of the first pattern by adjusting the etching conditions, the capacitor lower electrode can be covered with the dielectric film in areas between the capacitor upper electrodes, and reduction of the capacitor by the catalyst of the platinum-group metal constituting the capacitor lower electrode can be prevented.

Also, the capacitor upper electrodes and the capacitor lower electrode are patterned simultaneously. Therefore, the capacitor forming patterning executed after the formation of the capacitor upper electrodes can be eliminated, and also degradation of the shape of the capacitor upper electrodes by the re-etching can be prevented.

What is claimed is:

1. A manufacturing method of a semiconductor device comprising:
    forming a first insulating film over a semiconductor substrate;
    forming sequentially a first conductive film, a dielectric film, a second conductive film over the first insulating film;
    forming a first mask on the second conductive film;
    etching the second conductive film and the dielectric film into a first pattern shape by using the first mask;
    removing the first mask;
    forming the second masks having capacitor upper electrode shape on the second conductive film;
    etching simultaneously the first conductive film exposed from the dielectric film and the second masks, and the second conductive film having the first pattern shape exposed from the second masks to form capacitor upper electrodes made of the second conductive film; also forming a plate line as a capacitor lower electrode which has a contact region made of the first conductive film, while the dielectric film remains un-etched between the upper electrodes; and wherein the first mask has about a same shape as the plate line.

2. A manufacturing method of a semiconductor device according to claim 1, wherein the second masks have a second pattern that is overlapped with the contact region of the plate line, and third patterns each having a capacitor shape.

3. A manufacturing method of a semiconductor device according to claim 1, wherein the first pattern shape of first mask has a shape not covering the contact region of the plate line.

4. A manufacturing method of a semiconductor device according to claim 3, further comprising:
    forming the second masks have a second pattern that overlaps with an edge portion of the second conductive film having the first pattern, and
    forming an isolated conductive pattern made of the second conductive film in a region between the contact region of the plate line and the capacitor upper electrodes.

5. A manufacturing method of a semiconductor device according to claim 4, wherein the dielectric film is left between the isolated conductive pattern and the plate line.

6. A manufacturing method of a semiconductor device according to claim 1, wherein the first mask has an opening in the contact region of the plate line, and
    an opening that exposes the first conductive film in the contact region is formed in the second conductive film and the dielectric film having the first pattern.

7. A manufacturing method of a semiconductor device according to claim 6, wherein a frame-like isolated conductive pattern made of the second conductive film is formed near the contact region of the plate line after the second mask is removed.

8. A manufacturing method of a semiconductor device according to claim 7, wherein the dielectric film is left between the isolated conductive pattern and the plate line.

9. A manufacturing method of a semiconductor device according to claim 1, further comprising:
    forming a capacitor protection insulating film on the second conductive film, the dielectric film, and the first conductive film after the second conductive film and the dielectric film are shaped into the first pattern;
    forming the second mask on the capacitor protection insulating film;
    etching the capacitor protection insulating film in an area that is exposed from the second mask to leave selectively under the second mask; and
    forming the capacitor upper electrodes by etching the second conductive film in an area that is not covered with the second mask and the capacitor protection insulating film.

10. A manufacturing method of a semiconductor device according to claim 9, wherein the capacitor protection insulating film is also left in the contact region of the plate line and its periphery.

11. A manufacturing method of a semiconductor device according to claim 10, wherein the capacitor protection insulating film is formed of material that has a low selective etching ratio to the first conductive film or the second conductive film.

12. A manufacturing method of a semiconductor device according to claim 10, wherein the capacitor protection insulating film is formed of material that protects a capacitor consisting of the capacitor upper electrodes, the dielectric film, and the capacitor lower electrode.

13. A manufacturing method of a semiconductor device according to claim 1, wherein the capacitor upper electrodes are formed in two columns on the plate line and in plural on each of the two columns.

* * * * *